(12) United States Patent
Zhang et al.

(10) Patent No.: US 10,038,005 B1
(45) Date of Patent: Jul. 31, 2018

(54) SENSE CIRCUIT HAVING BIT LINE CLAMP TRANSISTORS WITH DIFFERENT THRESHOLD VOLTAGES FOR SELECTIVELY BOOSTING CURRENT IN NAND STRINGS

(71) Applicant: SanDisk Technologies LLC, Plano, TX (US)

(72) Inventors: Zhengyi Zhang, Mountain View, CA (US); Henry Chin, Fremont, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/619,791

(22) Filed: Jun. 12, 2017

(51) Int. Cl.
| | |
|---|---|
| G11C 16/04 | (2006.01) |
| H01L 27/1157 | (2017.01) |
| G11C 16/34 | (2006.01) |
| H01L 27/115 | (2017.01) |
| G11C 11/56 | (2006.01) |

(52) U.S. Cl.
CPC ...... *H01L 27/1157* (2013.01); *G11C 11/5621* (2013.01); *G11C 16/0483* (2013.01); *G11C 16/3427* (2013.01); *H01L 27/115* (2013.01)

(58) Field of Classification Search
CPC .................................................. G11C 16/0483
USPC ..................................................... 365/185.17
See application file for complete search history.

(56) References Cited

U.S. PATENT DOCUMENTS

| | | |
|---|---|---|
| 6,396,310 B2 | 5/2002 | Shin |
| 6,990,028 B2 | 1/2006 | Haga et al. |
| 7,330,375 B2 | 2/2008 | Daga et al. |
| 7,551,477 B2 | 6/2009 | Mokhlesi et al. |
| 7,590,002 B2 | 9/2009 | Mokhlesi et al. |
| 7,596,035 B2 | 9/2009 | Doyle et al. |
| 7,924,632 B2 | 4/2011 | Sato |
| 8,339,884 B2 | 12/2012 | Huang et al. |

(Continued)

OTHER PUBLICATIONS

Nekrashevich, S.S., et al., "Electronic structure of silicon oxynitride: Ab-initio and experimental study, comparison with silicon nitride," Journal of Applied Physics 110, Dec. 2011, 6 pages.

(Continued)

*Primary Examiner* — Hoai V Ho
(74) *Attorney, Agent, or Firm* — Vierra Magen Marcus LLP

(57) ABSTRACT

Techniques are provided to boost current in channels of memory strings during sensing operations based on a data pattern or a pattern of physical non-uniformities, such as non-uniform channel widths. In one aspect, sense circuits are modified for memory strings which typically store meta data in a high programmed state. A bit line clamping transistor in these sense circuits can be configured with a relatively low threshold voltage, resulting in a relatively high clamping voltage which in turn causes a higher string current during sensing. The lower threshold voltage can be achieved by at least one of a shorter control gate length, a smaller oxide thickness, a lower oxide dielectric constant, or a greater source and/or drain doping concentration. In another aspect, memory strings which expected to typically store high state data are fabricated with a relatively thicker channel and/or greater doping concentration.

19 Claims, 23 Drawing Sheets

(56) References Cited

U.S. PATENT DOCUMENTS

| 8,908,432 | B2 |  | 12/2014 | Kamei et al. |
| 9,082,502 | B2 |  | 7/2015 | Dunga et al. |
| 9,576,673 | B2 |  | 2/2017 | Jiang et al. |
| 2016/0358664 | A1 | * | 12/2016 | Li .................... G11C 16/3459 |

OTHER PUBLICATIONS

University of Cambridge, "Metal Oxide Semiconductor Field Effect Transistor (MOSFET)," DoITPoMS, downloaded on May 30, 2017, [https://www.doitpoms.ac.uk/tlplib/semiconductors/mosfet.php], 2 pages.

* cited by examiner

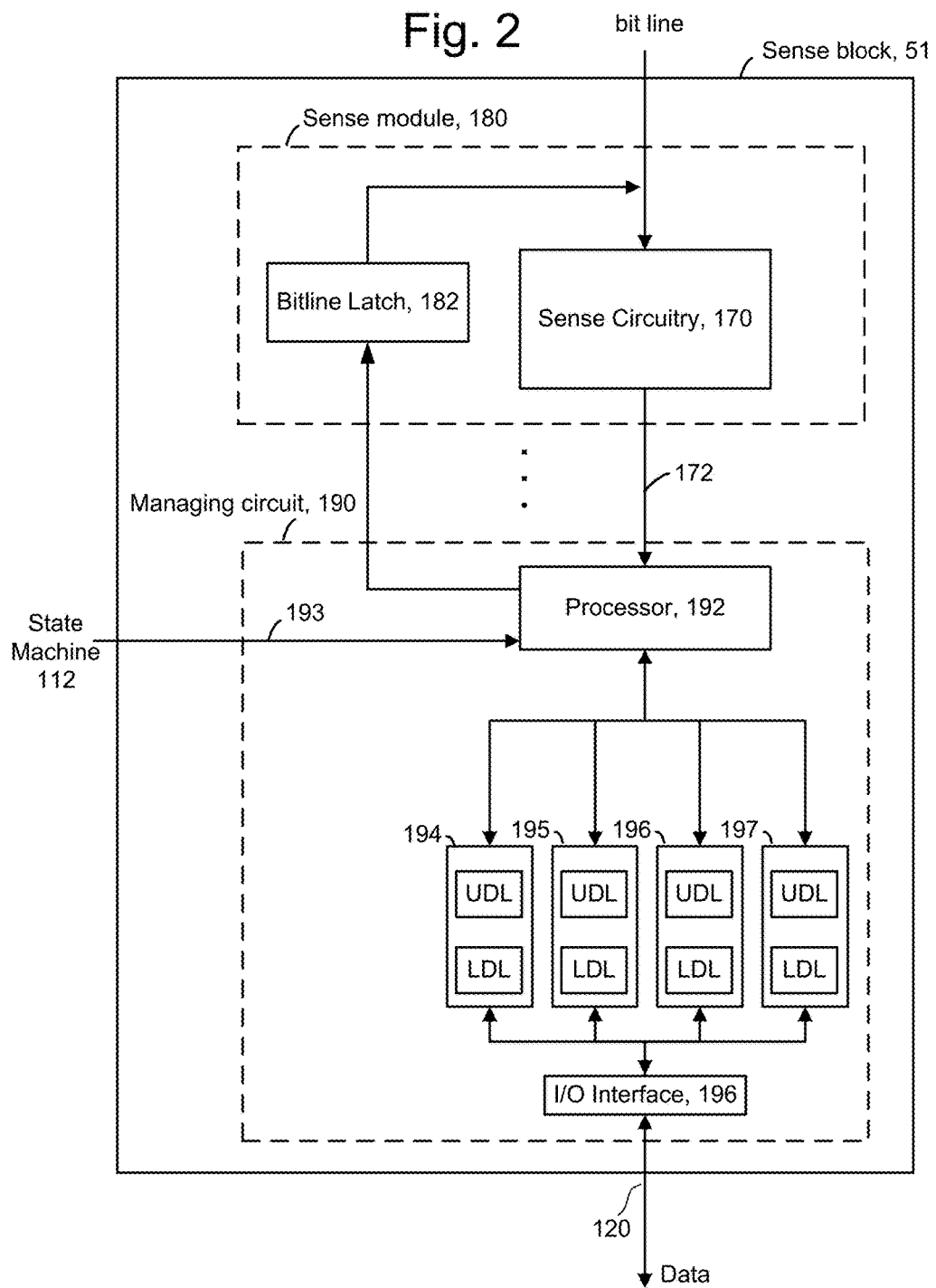

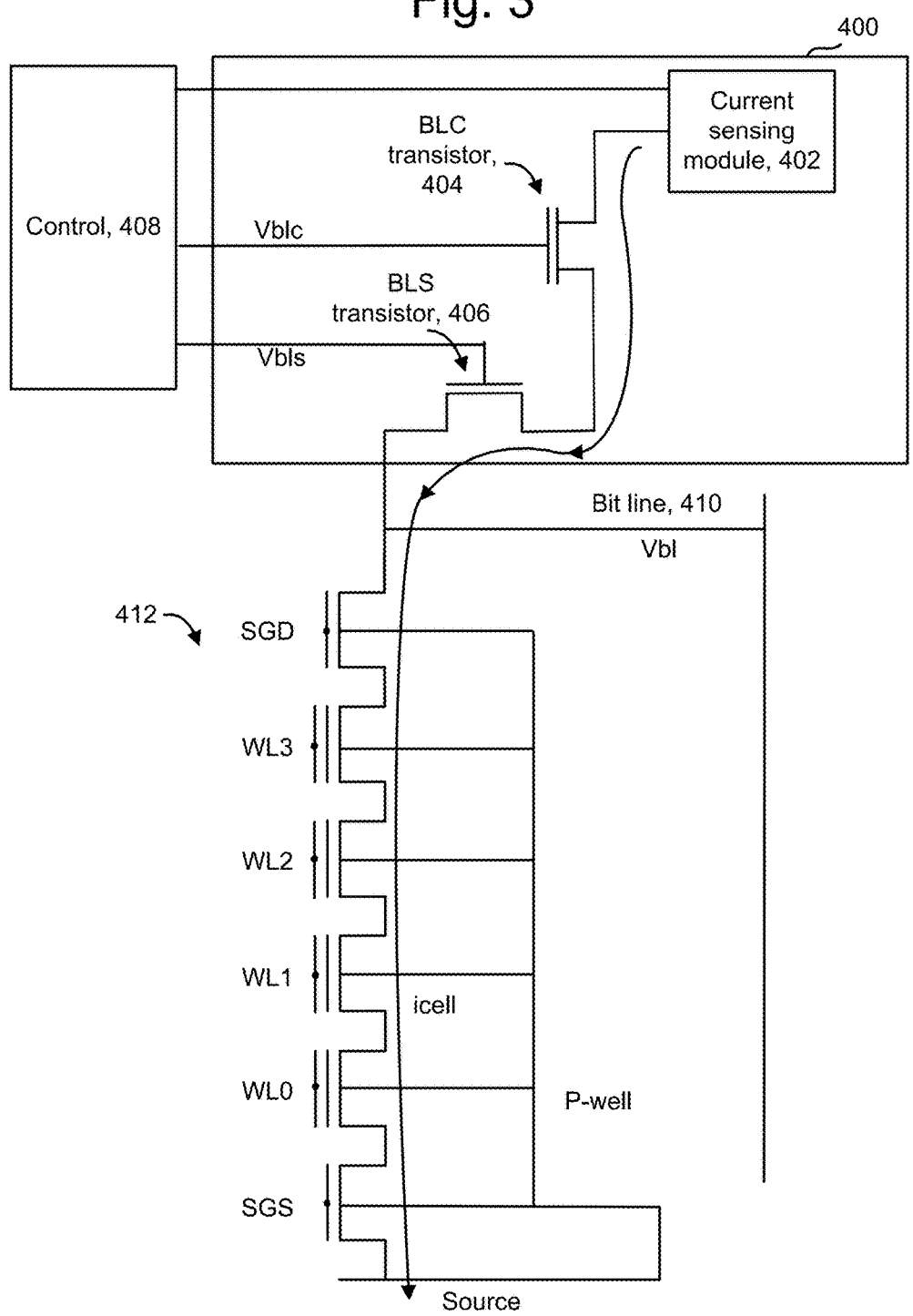

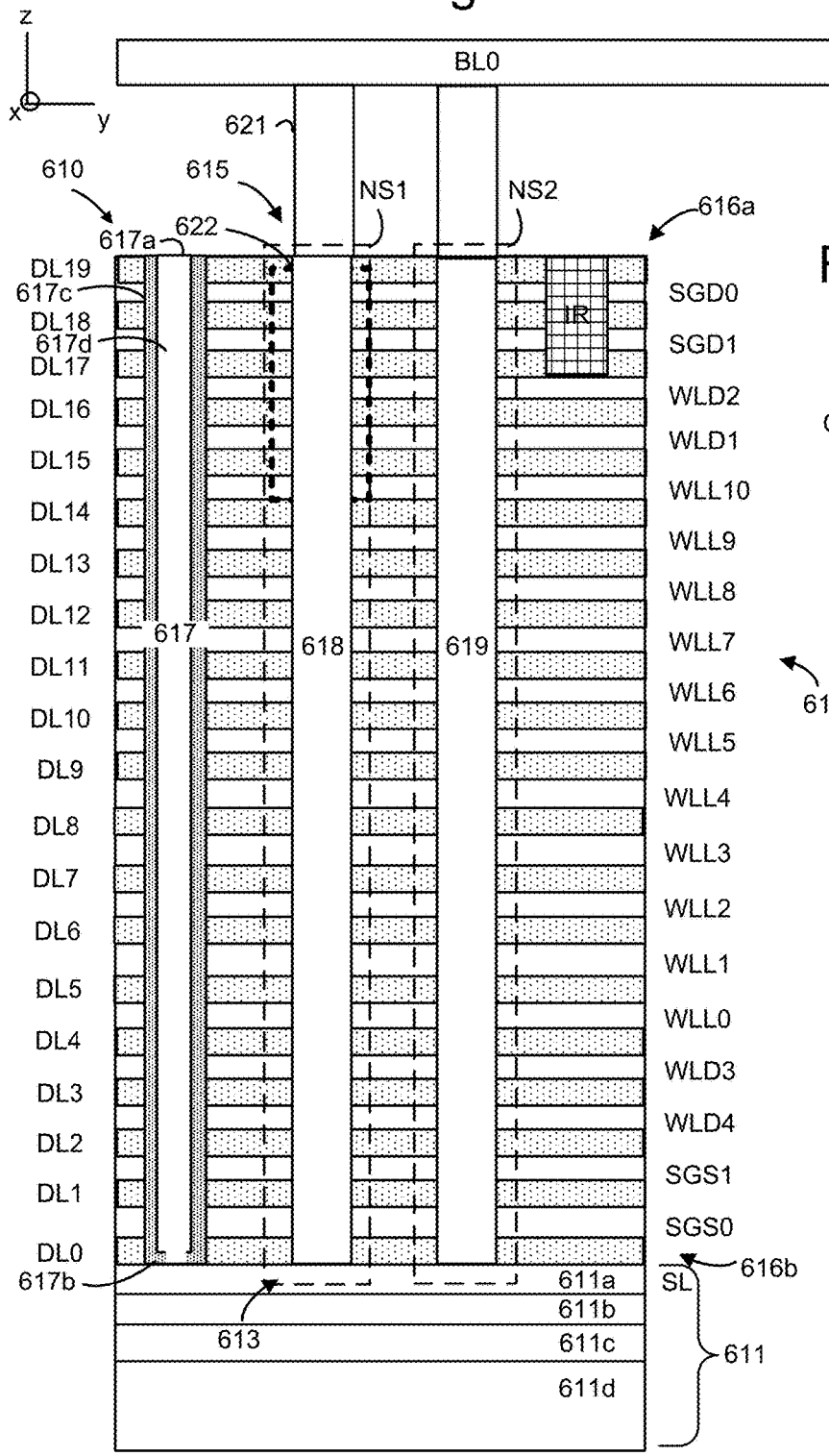
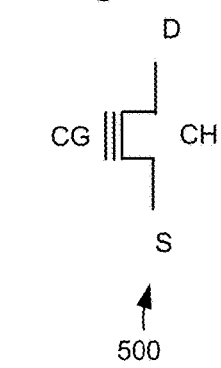
Fig. 7A
Fig. 7B

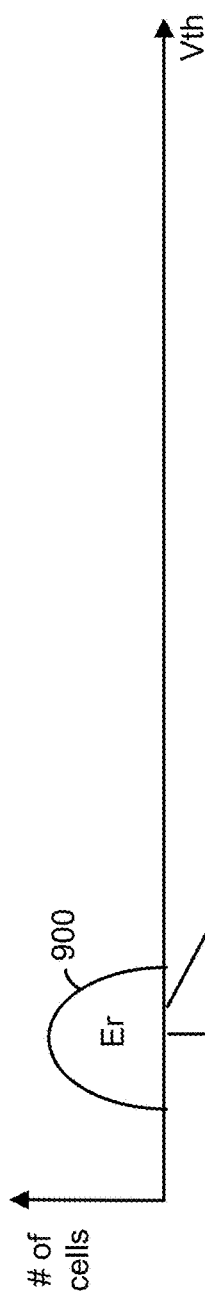
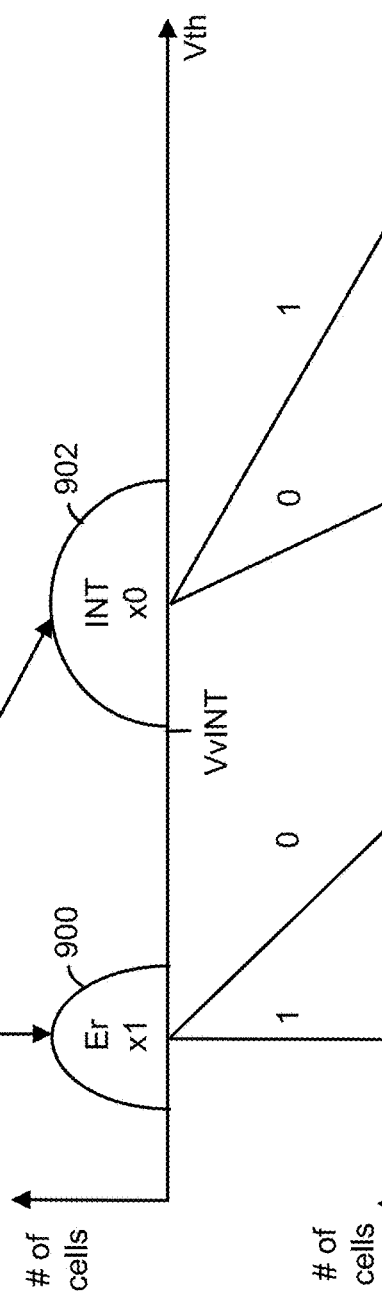
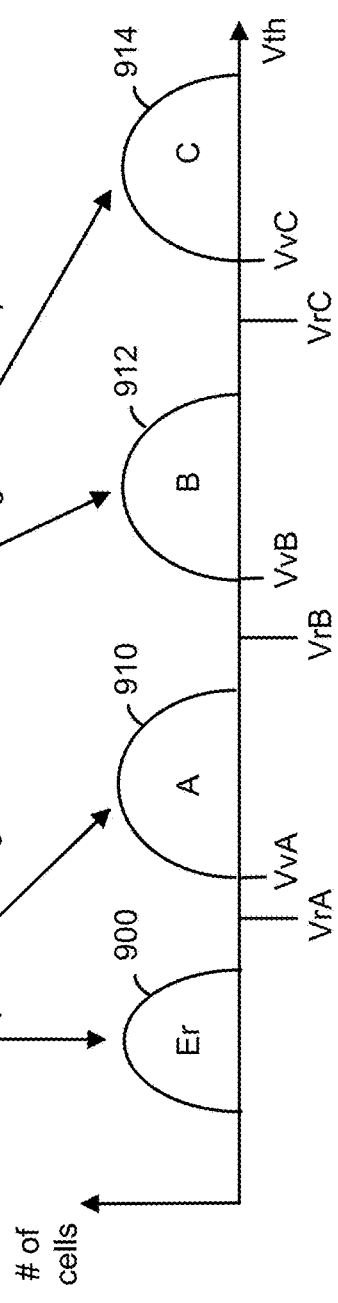
Fig. 10A
Fig. 10B
Fig. 10C

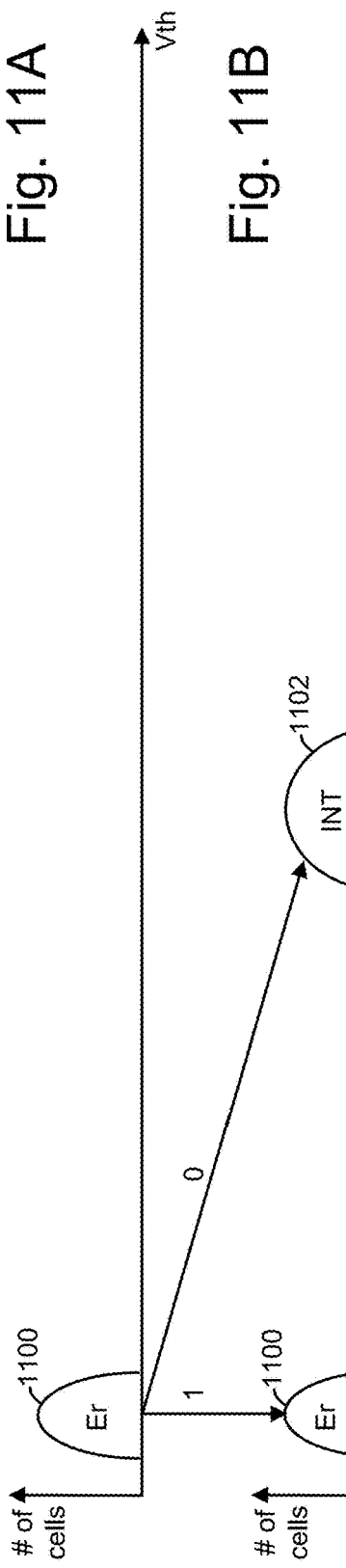

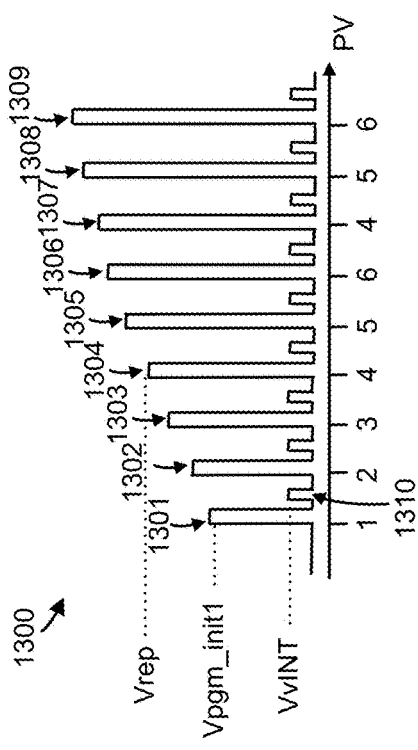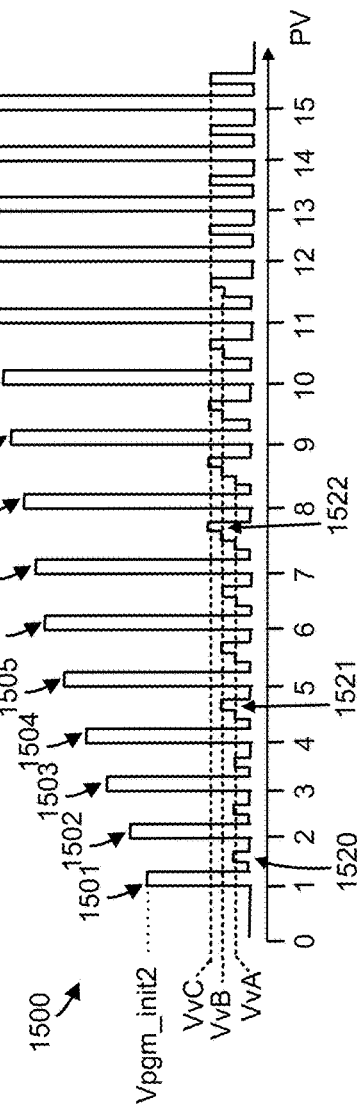

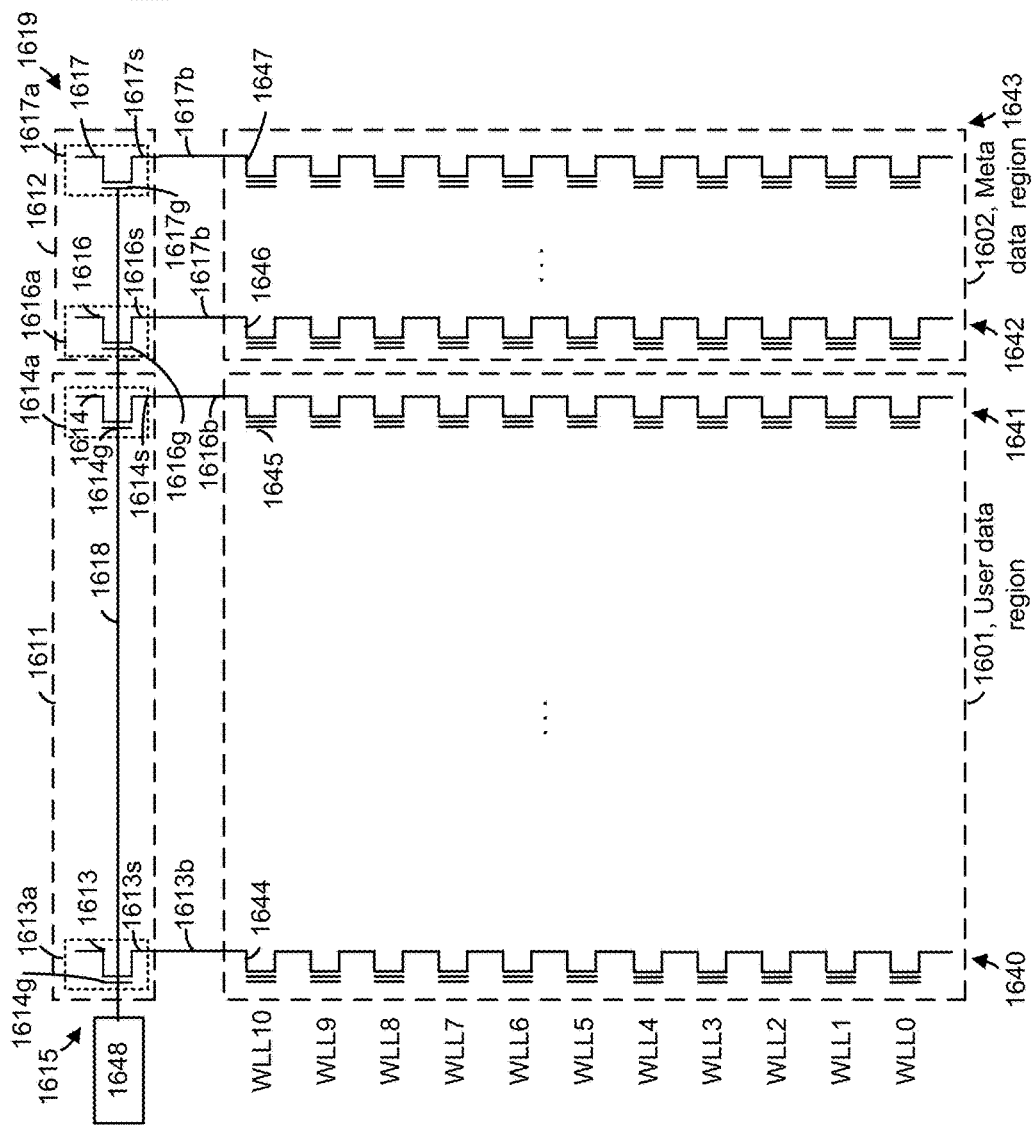

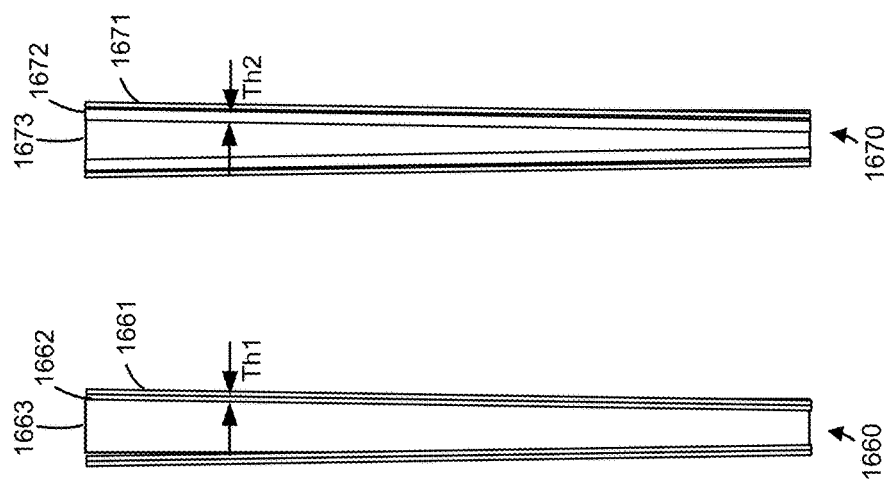

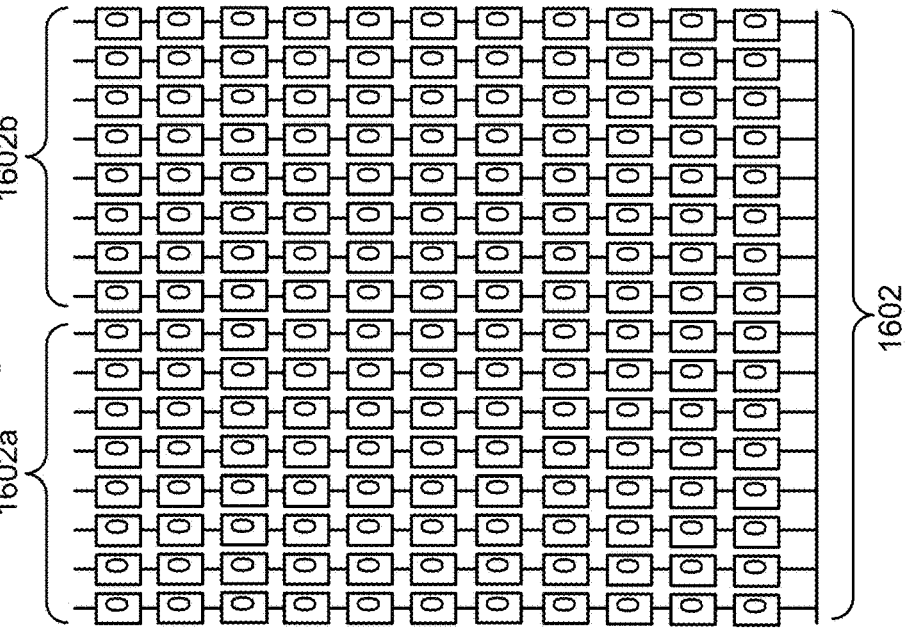
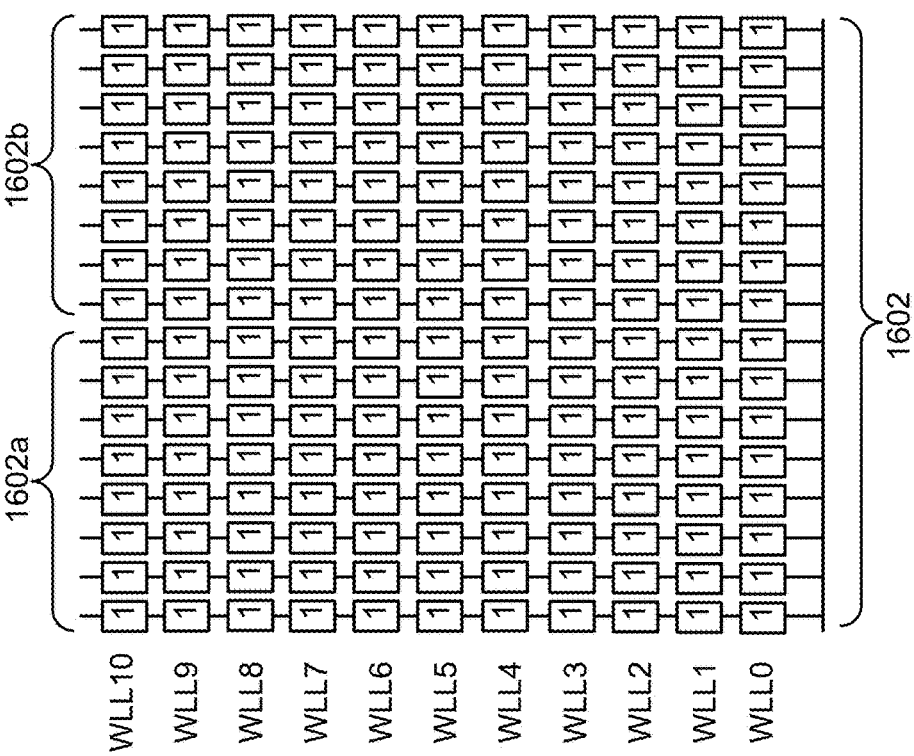

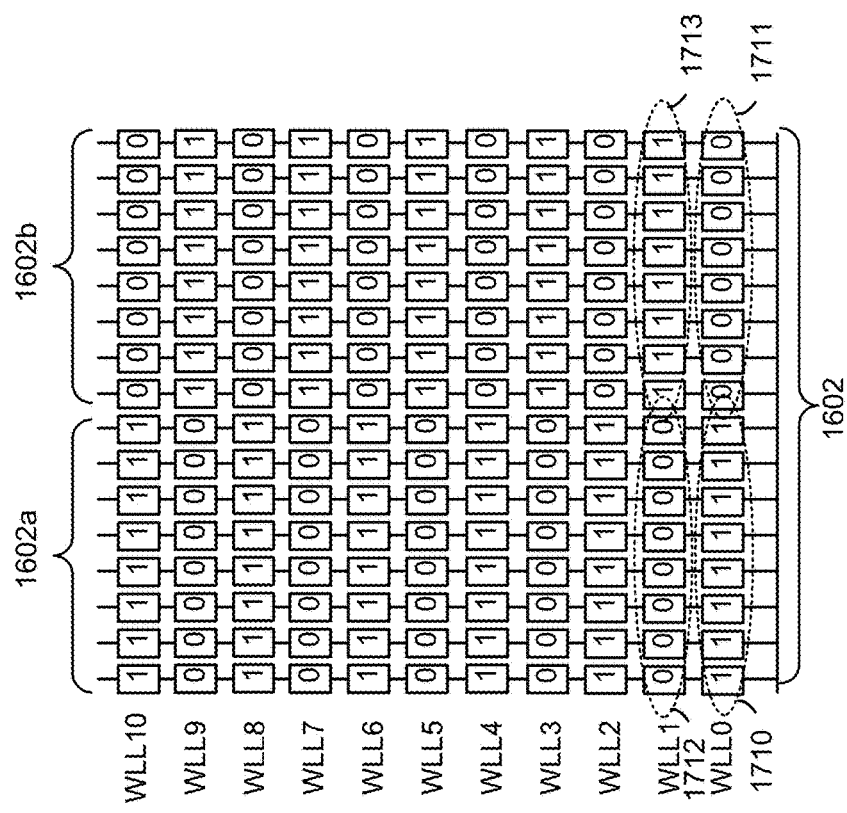

SENSE CIRCUIT HAVING BIT LINE CLAMP TRANSISTORS WITH DIFFERENT THRESHOLD VOLTAGES FOR SELECTIVELY BOOSTING CURRENT IN NAND STRINGS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. Moreover, sensing circuits may be connected to the bit lines for sensing a current in the strings. However, various challenges are presented in operating such memory devices.

BRIEF DESCRIPTION OF THE DRAWINGS

Like-numbered elements refer to common components in the different figures.

FIG. 2 is a block diagram depicting one embodiment of a sense block 51-53 of FIG. 1A.

FIG. 3 depicts a configuration of a NAND string and components for sensing.

FIG. 7A depicts an example cross-sectional view of a portion of one of the blocks of FIG. 6.

FIG. 7B depicts an example transistor 500.

FIG. 10A depicts an initial threshold distribution of an example two-pass programming operation involving four data states.

FIG. 10B depicts a threshold distribution which results after a first pass of the example two-pass programming operation of FIG. 10A.

FIG. 10C depicts a threshold distribution which results after a second pass of the example two-pass programming operation of FIG. 10A.

FIG. 11A depicts an initial threshold distribution of an example two-pass programming operation involving eight data states.

FIG. 11B depicts a threshold distribution which results after a first pass of the example two-pass programming operation of FIG. 11A.

FIG. 11C depicts a threshold distribution which results after a second pass of the example two-pass programming operation of FIG. 11A.

FIG. 12 depicts a series of program-verify iterations in an example of a programming pass for a lower page of data, consistent with FIGS. 10B and 11B.

FIG. 13 depicts a series of program-verify iterations in an example of a programming pass for an upper page of data, consistent with FIG. 10C.

FIG. 16B depicts memory strings and respective BLC transistors in the example block of memory cells of FIG. 16A.

FIG. 16C depicts an example pillar of a memory string having a channel layer with a relatively small width.

FIG. 16D depicts an example pillar of a memory string having a channel layer with a relatively large width.

FIG. 17A depicts an example of the meta data region of FIG. 16A where the cells are all in the erased (1) state.

FIG. 17B depicts an example of the meta data region of FIG. 16A where the cells are all in the programmed (0) state.

FIG. 17C depicts an example of the meta data region of FIG. 16A where bytes of erased state data and programmed state data alternate in successive rows.

DETAILED DESCRIPTION

Figure 1A:
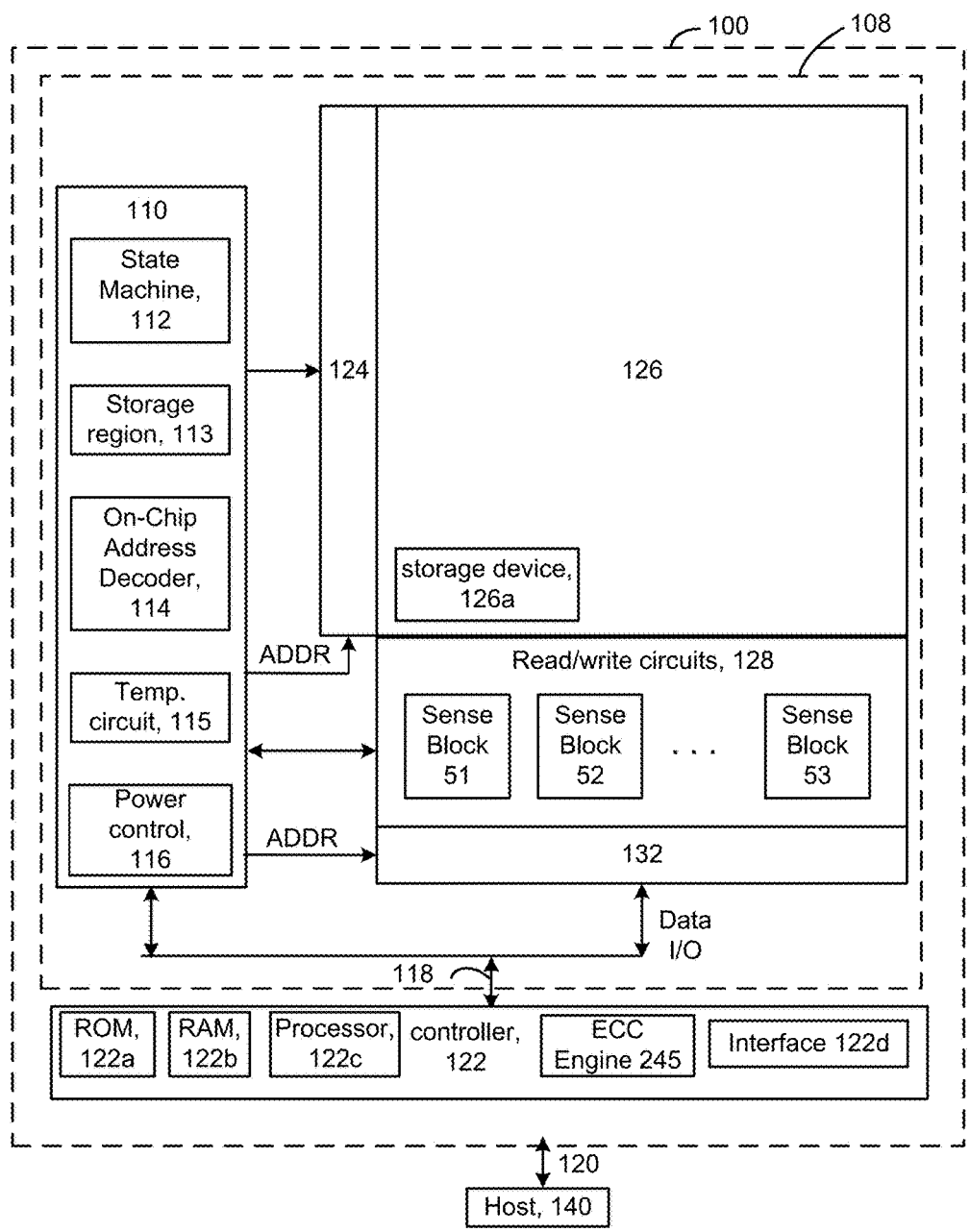
FIG. 1A is a block diagram of an example memory device.

A memory device is provided in which current is boosted in channels of memory strings based on a data pattern or physical non-uniformities, such as non-uniform channel widths, of the memory strings.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory strings extend in memory holes which are formed in the stack.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 10C). In a three-bit per cell memory device, there are eight data states including the erased state Er and seven higher data states referred to as the B-G states (see FIG. 11B). In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage (Vth) of the memory cell exceeds the read voltage. The read voltages are set at levels which are expected to be between the threshold voltage levels of adjacent data states.

However, during sensing operations, which include read and verify operations, it is difficult to sense low currents in the memory strings. For example, in a 3D memory structure, there is a trend to stack more layers together to improve the density of the memory device. However, this increases the height of the device and therefore the length and resistance of the channel. This results in a lower current in the channel during sensing operations which makes sensing more difficult. The sensing threshold current, which is the minimum current which represents a cell being in a conductive state, is forced to become lower, making the sensing operation more susceptible to various kinds of sensing noise and, as a result, reducing sensing accuracy. Moreover, the sensing time is increased since a longer time is needed to stabilize the sensing and minimize the sensing noise. This increase the time for a read or verify/programming operation It is desirable to maintain channel current and threshold sensing current at a relatively high level to avoid an increase in the duration of sensing operations. Raising the bit line bias during read/verify sensing is one way of increasing the channel current during a sensing operation. However, this increases power consumption. Maintaining a sufficient channel current in all memory channels during read/verify operations for higher read/program speeds while minimizing power consumption has become a problem in boosting overall memory performance.

Techniques provided herein address the above and other issues. The techniques maintain a sufficient channel current in all memory strings during sensing operations while minimizing power consumption. Sensing duration, noise and accuracy are improved.

The techniques recognize that the sensing process is limited by channels with the lowest current among all of the memory strings which are being sensed. The techniques maintain a sensing threshold level and a sensing speed by improving the channel current in the memory strings which are the most likely to have a low current during sensing, in the absence of the corrective measures provided herein. In some cases, the low current memory strings are found at certain fixed physical locations in a block. For example, on each word line, there may be certain byte locations which are used to store meta data. The meta data can be used, e.g., to provide information about the programming condition of data in a user data region of the word line, such as program-erase cycle hot count, a program time stamp indicating the time of the last programming of the word line, program temperature indicating a temperature at the time of the last programming of the word line, a lower page program flag indicating whether a lower page has been programmed into the word line and so forth. When this meta data is programmed, oftentimes the memory cells at the same position on many word lines of the block will be programmed to a same data state (same Vth level). If that data state is relatively high, the channel current on those memory strings can be quite low and can reduce the performance in terms of sensing duration, noise and accuracy.

When a small number of memory strings are likely to have particularly low channel current, a higher bit line bias can be provided during sensing or those memory strings. The sense circuits may include a bit line clamping (BLC) transistor which sets a voltage on the bit line during sensing. The BLC transistors of the sense circuits of a block typically have their control gates connected to one another and to a common voltage source. Accordingly, it is not possible to increase the bit line bias for the low current strings without affecting the remaining strings. A solution is to selectively provide a higher bit line bias for the low current strings. It is proposed that the BLC transistors for the low current strings be fabricated with a lower Vth. In this way, a higher bit line bias will be applied to the low current strings, thereby increasing the current, while a normal bit line bias can still be used for majority of the memory strings to keep the power consumption low. A lower Vth of a BLC transistor can be realized, e.g., by modifying the physical configuration of the transistor as discussed herein.

In one aspect, a set of memory strings is connected to respective sense circuits. A first set of the memory strings comprises user data which is generally random data and a second set of memory strings comprises meta data which may be non-random. In some cases, the meta data comprises cells which are typically in a high programmed data state. Memory strings with these high state cells will have a relatively low current during sensing operations. To compensate, the sense circuits for the second set of memory strings can be different than the sense circuits for the first set of memory strings. In one approach, the sense circuits for the second set of memory strings have a bit line clamping transistor that has a lower threshold voltage compared to the sense circuits for the first set of memory strings. The lower threshold voltage can be achieved in different ways such as by at least one of shorter control gate length, a smaller oxide thickness, a lower oxide dielectric constant, or a greater source and/or drain doping concentration or ion implantation energy/dose. Thus, the sense circuits and the bit line clamping transistors can be configured according to an expected data pattern in the associated strings of memory cells.

The lower threshold voltage allows for a higher voltage on the bit line when the bit line clamping transistor is configured as a source-follower transistor. That is, the source voltage is equal to the gate voltage minus the threshold voltage as an approximation.

In another aspect, memory strings which expected to typically store high state data are fabricated with a relatively thicker channel and/or greater doping concentration. Thus, the channel thickness and/or doping concentration is based on an expected data pattern in the associated strings of memory cells. A thicker channel and a greater doping concentration results in a greater current during sensing.

In another aspect, there is a repeated pattern in the thickness of the channel widths of the memory strings due to a non-uniformity in the fabrication process. The bit line clamping transistors can be configured according to the pattern so that strings with a relatively narrow channel have a relatively lower threshold voltage.

In another aspect, the location of the high state data is varied in different word lines and alternated with low state data to avoid an excessive number of high state cells and thereby increase the memory string current.

The above and other features are discussed herein.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a temperature-sensing circuit 115 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The temperature-sensing circuit may detect a temperature of the memory device. A control may be circuit configured to vary a position of a subset of memory cells allocated to meta data in different word lines of a set of word lines when a temperature is below a threshold. See, e.g., FIG. 17C. See FIG. 1B for further details of a temperature-sensing circuit.

The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end or source side of a NAND string, and an SGD transistor is a select gate transistor at a drain-end or drain side of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels.

Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
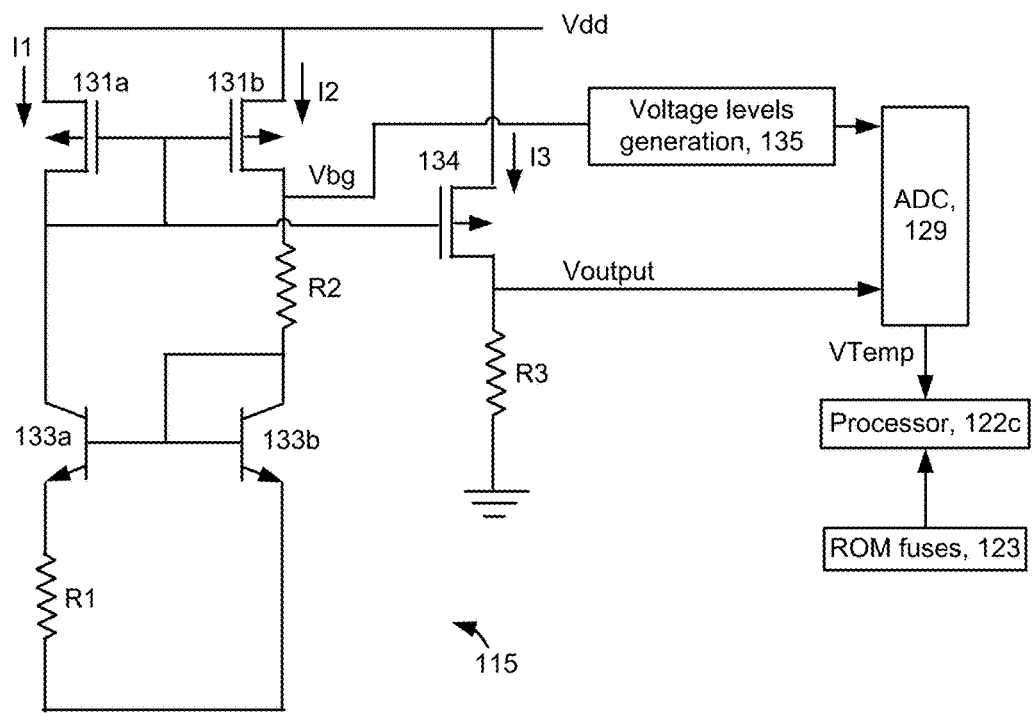
FIG. 1B depicts an example of the temperature-sensing circuit 115 of FIG. 1A.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of a sense block 51-53 of FIG. 1A. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

FIG. 3 depicts a configuration of a NAND string and components for sensing. In one implementation, sense circuits 400 are provided in the sense block 51 of FIG. 1A, and a control 408 is provided by the control circuitry 110 of FIG. 1A. In a simplified example, a NAND string 412 includes four storage elements which are in communication with word lines WL0, WL1, WL2 and WL3, respectively. In practice, additional storage elements and word lines can be used. Further, additional NAND strings are typically arranged adjacent to one another in a block or other set of non-volatile storage elements. The storage elements are coupled to a p-well region of a substrate. A bit line 410 having a voltage Vbl is depicted, in addition to sense circuit 400. In particular, a BLS (bit line sense) transistor 406 is coupled to the bit line 410. The BLS transistor 406 is a high voltage transistor, and is opened in response to a control 408 during sense operations. A BLC (bit line clamping) transistor 404 is a low voltage transistor which is opened in response to the control 408 to allow the bit line to communicate with a current sensing module 402. During a sense operation, such as a read or verify operation, a pre-charge operation occurs in which a capacitor in the current sensing module 402 is charged. The BLC transistor 404 may be opened to allow the pre-charging. Also during the sense operation, a verify voltage is applied to a word line of one or more storage elements involved in the operation.

As mentioned at the outset, the BLC transistor may be configured differently in the sense circuits of different memory strings based on, e.g., an expected data pattern and/or a pattern of non-uniformities in the fabrication process for the memory device.

At the drain side of the NAND string 412, the BLS transistor 406 is turned on, e.g., made conductive or opened. Additionally, a voltage Vblc is applied to the BLC transistor 404 to make it conductive. The bit line voltage Vbl is set or clamped based on the control gate voltage Vblc minus the Vth of the BLC transistor. The bit line is connected to the source terminal of the BLC transistor and the BLC transistor operates in a source-follower configuration.

The pre-charged capacitor in the current sensing module 402 discharges through the bit line and into the source so that the source acts as a current sink. The pre-charged capacitor at the drain of the NAND string may be pre-charged to a potential which exceeds a potential of the source so that a current flows through the selected non-volatile storage element and sinks into the source when the selected storage element is in the conductive state.

The pre-charged capacitor does not appreciably discharge when the storage element is in a non-conductive state. After a discharge period, resulting data can be transferred to a managing/control circuit to monitor and control the programming of each storage element.

Figure 4:
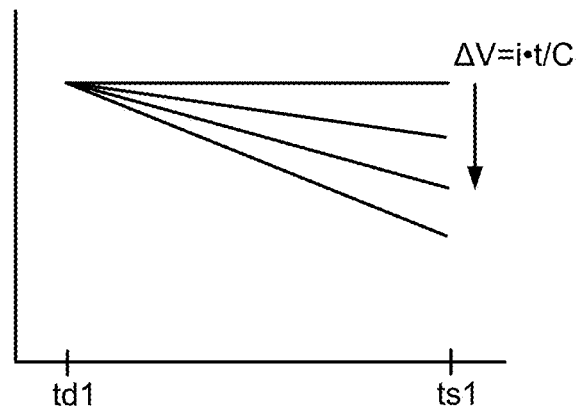
FIG. 4 depicts current sensing based on a change in voltage, in an example implementation of the current sensing module 402 in FIG. 3.

In particular, if the selected storage element is in a conductive state due to the application of Vcgr, a relatively high current will flow. If the selected storage element is in a non-conductive state, no or relatively little current will flow. The current sensing module 402 can sense the cell/storage element current, icell. In one possible approach, the current sensing module determines a voltage drop which is tied to a fixed current flow by the relationship $\Delta V = i \cdot t/C$, where $\Delta V$ is the voltage drop, i is the fixed current, t is a predetermined discharge time period and C is the capacitance of the pre-charged capacitor in the current sensing module. See also FIG. 4, which depicts current sensing based on a change in voltage, in an example implementation of the current sensing module 402 in FIG. 3. A greater voltage drop represents a higher current. At the end of a given discharge period, since i and C are fixed, $\Delta V$ for a given current can be determined. In one approach, a PMOS transistor is used to determine a level of $\Delta V$ relative to a demarcation value. In another possible approach, a cell current discriminator serves as a discriminator or comparator of current levels by determining whether the conduction current is higher or lower than a given demarcation current.

Voltage sensing, in contrast, does not involve sensing a voltage drop which is tied to a fixed current. Instead, voltage sensing involves determining whether charge sharing occurs between a capacitor in a voltage sensing module and a capacitance of the bit line. Current is not fixed or constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

The current sensing module 402 thus can determine whether the selected storage element is in a conductive or non-conductive state by the level of current. Generally, a higher current will flow when the selected storage element is in a conductive state and a lower current will flow when the selected storage element is in a non-conductive state. A threshold voltage of the selected storage element is above or below a compare level, such as a verify level or a read level, when it is in a non-conductive state or a conductive state, respectively.

Figure 5:
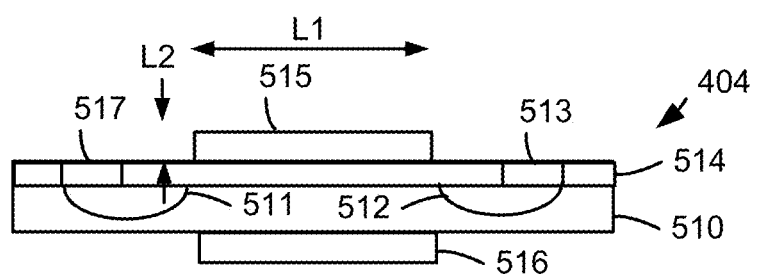
FIG. 5 depicts an example implementation of the BLC transistor 404 of FIG. 3.

FIG. 5 depicts an example implementation of the BLC transistor 404 of FIG. 3. The transistor may be an n-MOSFET, for example. The transistor includes a lightly doped p-type substrate 510 comprising a source terminal 511 and a drain terminal 512, which are heavily doped n-type. Metallized contacts 517 and 513 are provided in an oxide layer 514. The substrate surface is covered with a thin oxide film. The gate electrode 515 is on top of the insulating oxide layer, and the body electrode 516 in the above diagram provides a counter electrode to the gate. The thin oxide film may contain, e.g., silicon dioxide (SiO2), silicon nitride (Si3N4) or silicon oxynitride (Si2N2O).

As mentioned, the bit line voltage is equal to the voltage at the source terminal 511. This voltage in turn is equal to the control gate voltage minus the threshold voltage (Vth) of the transistor. To increase the bit line voltage, the Vth can be decreased. At least one of a shorter control gate length (L1), a smaller oxide thickness (L2), a lower oxide dielectric constant (for the oxide layer 514), or a greater source and/or drain doping concentration, are associated with a reduced Vth.

The control gate length can be set during the fabrication process of the memory device using appropriate masking, deposition and etching techniques. Thus, one approach to compensating for a low current in a memory string is to provide a relatively shorter control gate length for the associated BLC transistors in the sense circuits.

The oxide thickness can be set during the fabrication process of the memory device using appropriate masking, deposition and etching techniques. Thus, one approach to compensating for a low current in a memory string is to provide a relatively smaller oxide thickness for the associated BLC transistors in the sense circuits.

Regarding the dielectric constant of the oxide layer, as mentioned, a lower oxide dielectric constant is associated with a reduced Vth. Thus, one approach to compensating for a low current in a memory string is to provide a gate oxide in the BLC transistor with a relatively smaller dielectric constant. For example, silicon dioxide (SiO$_2$) with a dielectric constant of about 3.9 can be used instead of silicon oxynitride (Si2N2O) with a dielectric constant of about 4.6.

The doping concentration can be set during the fabrication process of the memory device using an appropriate doping process, e.g., ion implantation or diffusion. Ion implantation involves accelerating charged dopants (ions) in an electric field and irradiating the dopant onto a wafer. The penetration depth can be set based on the voltage used to accelerate the ions. A greater dopant concentration can be associated with a longer period of ion implantation.

Diffusion involves net transport of molecules from a region of higher concentration to one of lower concentration by random molecular motion. The result of diffusion is a gradual mixing of materials. The speed of the diffusion process depends on several factors including the dopant, the concentration gradient, the temperature, the substrate and the crystallographic orientation of the substrate. Diffusion methods include diffusion from the gas phase, a solid source or a liquid source. For diffusion from the gas phase, a carrier gas such as nitrogen or argon is enriched with the desired dopant in gaseous form and provided to the silicon wafer. Phosphorus or arsenic are example dopants for providing the n-type source/drain regions 511 and 512. A greater dopant concentration can be associated with a longer period of diffusion, a higher concentration of the dopant in the carrier gas and a higher temperature.

Thus, one approach to compensating for a low current in a memory string is to provide a relatively greater doping concentration in the source and/or drain regions of the associated BLC transistors in the sense circuits.

The above approaches can be combined as well.

Figure 6:
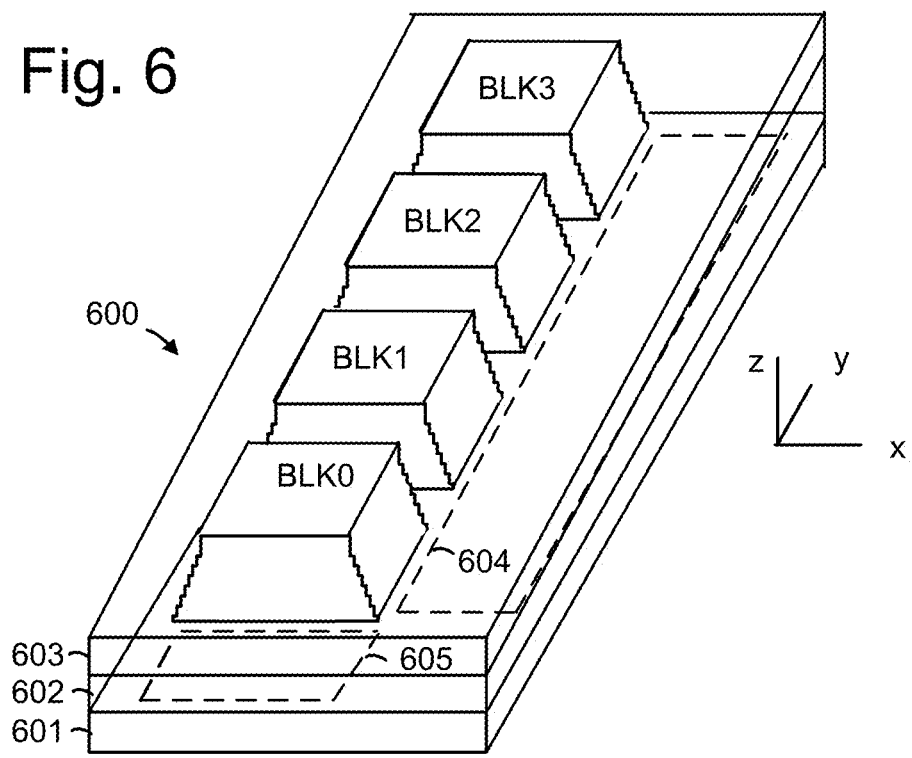
FIG. 6 is a perspective view of a memory device 600 comprising a set of blocks in a plane in an example 3D configuration of the memory structure 126 of FIG. 1.

FIG. 6 is a perspective view of a memory device 600 comprising a set of blocks in a plane in an example 3D configuration of the memory structure 126 of FIG. 1. On the substrate 601 are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set. of blocks.

The circuitry can include voltage drivers which can be connected to control gate layers, bit lines and source lines of the blocks. The substrate can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions. Typically, the length of the blocks is much longer in the x-direction than the width in the y-direction.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 7A depicts an example cross-sectional view of a portion of one of the blocks of FIG. 6. The block comprises a stack 610 of alternating conductive and dielectric layers. The block comprises conductive layers spaced apart vertically, and the conductive layers comprise word lines connected to the memory cells and select gate lines connected to SGD and SGS transistors.

In this example, the conductive layers or plates comprise two SGD layers, two SGS layers and four dummy word line layers (or word lines) WLD1, WLD2, WLD3 and WLD4, in addition to data word line layers (or word lines) WLL0-WLL10. WLD2 is a topmost dummy word line layer, and WLD1 is another dummy word line layer which is below the topmost dummy word line layer and above the topmost or drain-side data word line WLL10. WLD3 and WLD4 are source side dummy word line layers. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 8.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 or the plurality of word line layers and a drain-end 615 at a top 616a of the stack or the plurality of word line layers. Local interconnects, such as interconnect 617, may be provided periodically across the stack. The local interconnects may be metal-filled slits which extend through the stack, such as to connect the source line/substrate to a line above the stack. The metal 617d is isolated from the word line layers by an insulating material 617c. The slits may be used during the formation of the word lines and subsequently filled with metal. Specifically, a stack may be formed with a sacrificial material such as SiN for the word lines layers alternating with dielectric layers such as oxide. Slits are etched periodically in the stack down to the substrate, thereby exposing portions of the sacrificial material. An etchant such as hot phosphoric acid is deposited in the slits to remove the sacrificial material, forming voids. A metal is then deposited in the voids via the slits, thus forming the final word line layers. Subsequently, the metal in the slits is cleaned away and the insulating material 617c is deposited along the sidewalls of the slits. A hole is etched in the bottom of the insulation layer. The remainder of the slits is filled with the metal 617d which extends through the hole to the substrate and up to the top of the stack, thus forming a conductive path or local interconnect from the bottom to the top of the stack.

A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is etched through to provide a contact to the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects, e.g., pillars or posts, connect to each layer, including the SGS, WL and SGD layers, and extend upward to horizontal paths to voltage sources. See FIG. 15.

This example includes two SGD transistors, two drain side dummy memory cells, two source side dummy memory cells and two SGS transistors in each string, as an example. Generally, one or more SGD transistors and one or more SGS transistors may be provided in a memory string.

An isolation region IR may be provided to separate portions of the SGD layers from one another to provide one independently driven SGD line or layer portion per sub-block. The isolation region comprises an insulating material such as oxide. In one example, the word line layers are common to all sub-blocks in a block. The drain-side dummy word line layers may have a separate portion for each sub-block, a portion which is shared by multiple sub-blocks of a block but fewer than all sub-blocks of the block and/or a single portion which is shared by all sub-blocks of a block.

FIG. 7B depicts an example transistor 500. The transistor comprises a control gate CG, a drain D, a source S and a channel CH. During a programming operation, the transistor has a positive gate-to-channel voltage. During an erase operation, the transistor has a positive channel-to-gate voltage.

Figure 8:
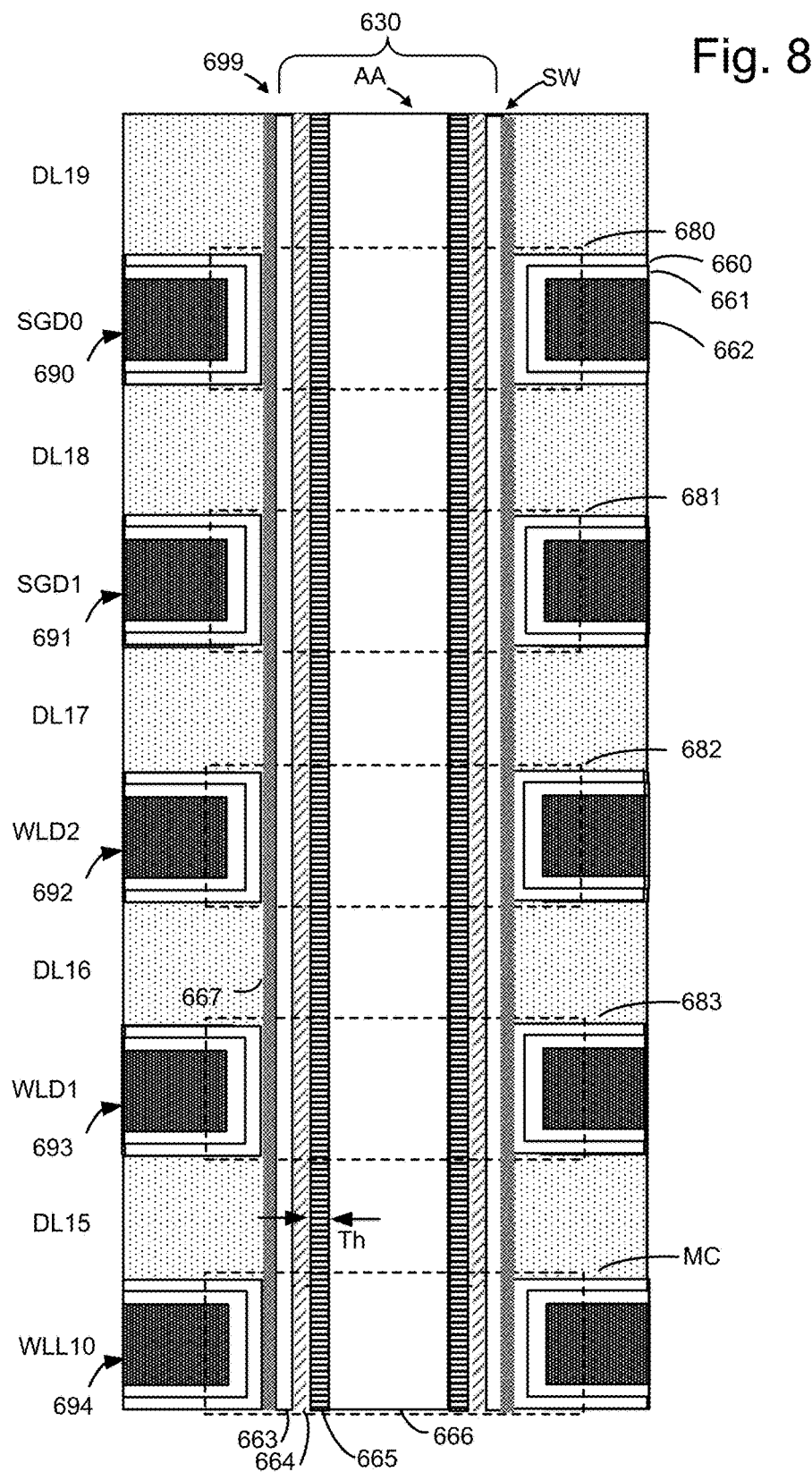
FIG. 8 depicts a close-up view of the region 622 of the stack of FIG. 7A.

FIG. 8 depicts a close-up view of the region 622 of the stack of FIG. 7A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a blocking oxide 667, a charge-trapping layer 663 or film such as silicon nitride ($Si_3N_4$) or other nitride, a tunneling layer 664 (such as oxide), a channel layer 665 (e.g., comprising polysilicon), and a dielectric core 666. A word line layer can include a block high-k material 660, a metal barrier 661, and a conductive metal 662 such as Tungsten as a control gate. For example, control gates 690, 691, 692, 693 and 694 are provided. Additional pillars are similarly formed in the different memory holes. A pillar can form a columnar active area (AA) of a NAND string. The channel layer has a thickness Th. As mentioned herein, the channel thickness can be greater for memory strings which are expected to have high state memory cells, in one approach. This increased width provides a reduced resistance and therefore an increased current. See FIGS. 16C and 16D.

The channel width can be controlled during the fabrication process. In one approach, memory holes are formed and channel films are deposited in one part of a stack, e.g., associated with user data, separately from the formation of memory holes and the deposition of channel films in another part of a stack, e.g., associated with meta data. The deposition of the channel layer can occur over a relatively longer period to provide a relatively thicker channel layer.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 9A:
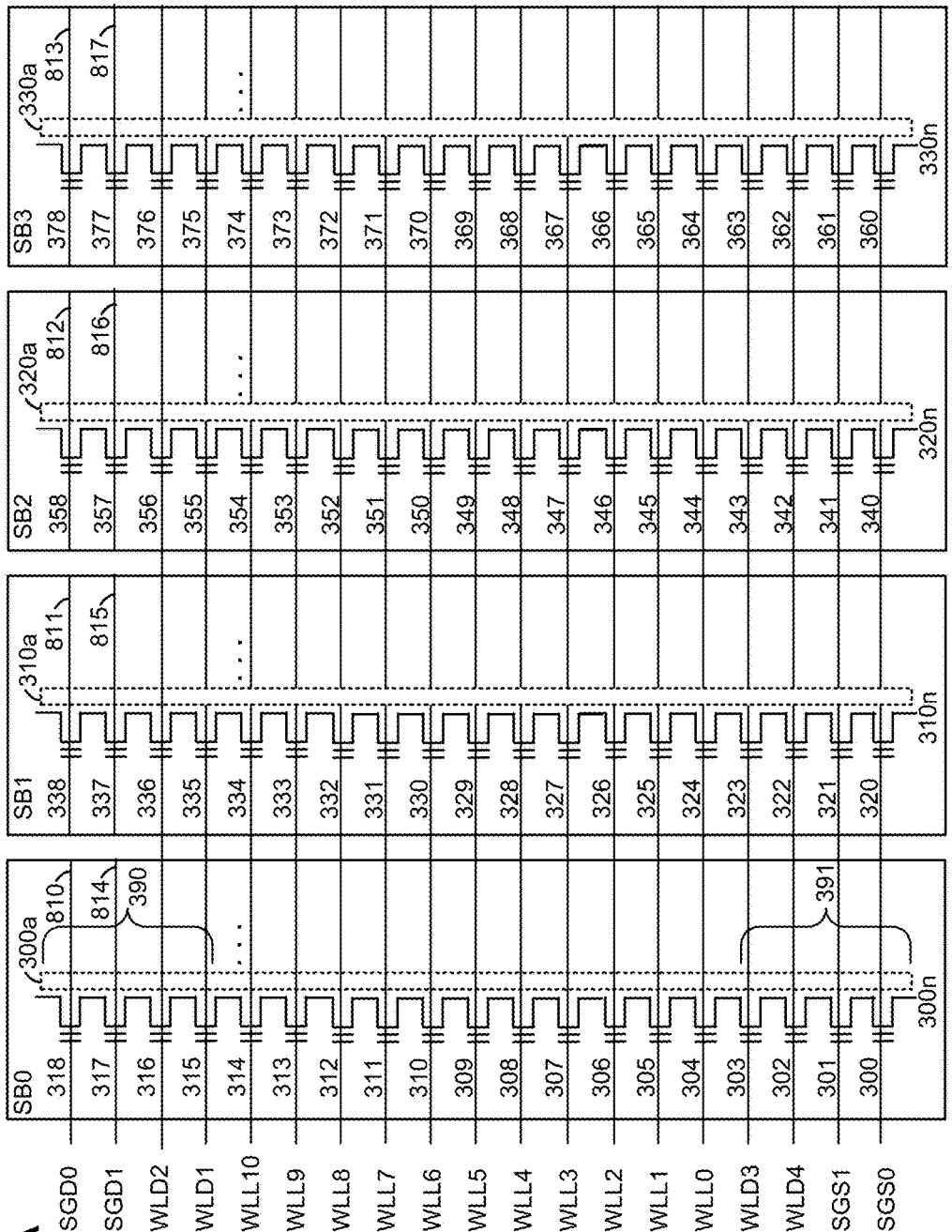
FIG. 9A depicts an example implementation of the memory structure 126 of FIG. 1A comprising NAND strings in sub-blocks in a 3D configuration.

FIG. 9A depicts an example implementation of the memory structure 126 of FIG. 1A comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack is filled with materials which form memory cells adjacent to the word lines.

Further, each block can be divided into sub-blocks and each sub-block includes multiple NAND strings, where one example NAND string is depicted. For example, sub-blocks SB0, SB1, SB2 and SB3 comprise example NAND strings 300n, 310n, 320n and 330n, respectively. The NAND strings have data word lines, dummy word lines and select gate lines. Each sub-block comprises a set of NAND strings which extend in the x direction and which have a common SGD line. SB0 has SGD lines or SGD layer portions 810 and 814 in the SGD0 and SGD1 layers, respectively. SB1 has SGD layer portions 811 and 815 in the SGD0 and SGD1 layers, respectively. SB2 has SGD layer portions 812 and 816 in the SGD0 and SGD1 layers, respectively. SB3 has SGD layer portions 813 and 817 in the SGD0 and SGD1 layers, respectively. Each of the data word line layers WLL0 to WLL10 and the SGS layers SGS0 and SGS1 is shared by all of the sub-blocks SB0 to SB3.

The NAND strings 300n, 310n, 320n and 330n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 300n, 310n, 320n and 330n have channels 300a, 310a, 320a and 330a, respectively. Each channel has a drain end and a source end. For example, channel 300a has a drain end 390 and a source end 391.

Additionally, NAND string 300n includes SGS transistors 300 and 301, dummy memory cells 302 and 303, data memory cells 304, 305, 306, 307, 308, 309, 310, 311, 312, 313 and 314, dummy memory cells 315 and 316, and SGD transistors 317 and 318.

NAND string 310n includes SGS transistors 320 and 321, dummy memory cells 322 and 323, data memory cells 324, 325, 326, 327, 328, 329, 330, 331, 332, 333 and 334, dummy memory cells 335 and 336, and SGD transistors 337 and 338.

NAND string 320n includes SGS transistors 340 and 341, dummy memory cells 342 and 343, data memory cells 344, 345, 346, 347, 348, 349, 350, 351, 352, 353 and 354, dummy memory cells 355 and 356, and SGD transistors 357 and 358.

NAND string 330n includes SGS transistors 360 and 361, dummy memory cells 362 and 363, data memory cells 364, 365, 366, 367, 368, 369, 370, 371, 372, 373 and 374, dummy memory cells 375 and 376, and SGD transistors 377 and 378.

Figure 9B:
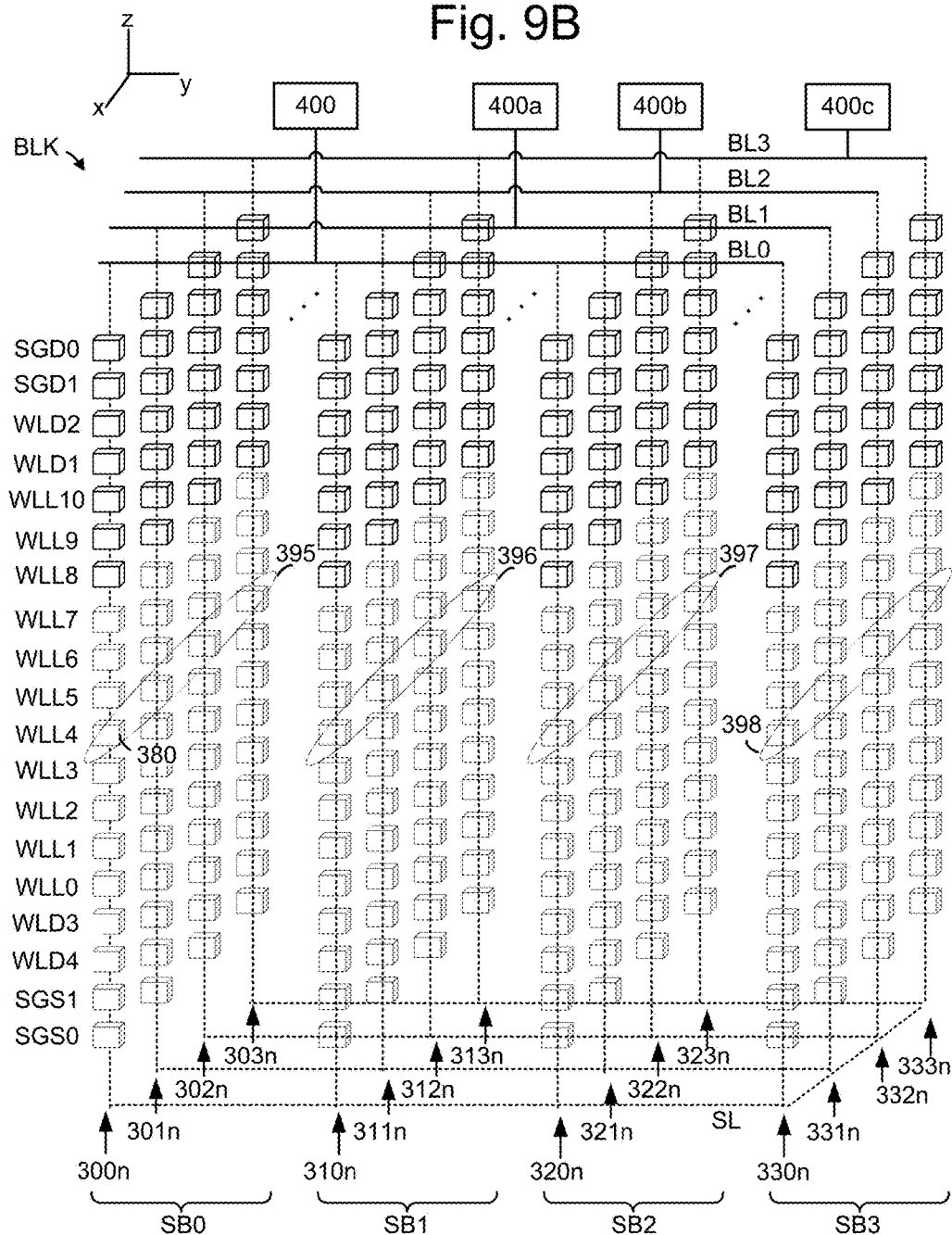
FIG. 9B depicts a perspective view of sub-blocks SB0-SB3 consistent with FIG. 9A.

FIG. 9B depicts a perspective view of sub-blocks SB0-SB3 consistent with FIG. 9A. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell is depicted as a cube for simplicity. SB0 includes NAND strings 300n, 301n, 302n and 303n. SB1 includes NAND strings 310n, 311n, 312n and 313n. SB2 includes NAND strings 320n, 321n, 322n and 323n. SB3 includes NAND strings 330n, 331n, 332n and 333n. Bit lines are connected to sets of NAND strings. For example, a bit line BL0 is connected to NAND strings 300n, 310n, 320n and 330n, a bit line BL1 is connected to NAND strings 301n, 311n, 321n and 331n, a bit line BL2 is connected to NAND strings 302n, 312n, 322n and 332n, and a bit line BL3 is connected to NAND strings 303n, 313n, 323n and 333n. A sense circuit may be connected to each bit line. For example, sense circuits 400, 400a, 400b and 400c are connected to bit lines BL0, BL1, BL2 and BL3, respectively. The NAND strings are examples of vertical memory strings which extend upward from a substrate.

Programming and reading can occur for selected cells of one word line and one sub-block at a time. This allows each selected cell to be controlled by a respective bit line. For example, an example set 395 of memory cells (including an example memory cell 380) in SB0 is connected to WLL4. Similarly, the sets 396, 397 and 398 comprise data memory cells in SB1, SB2 and SB3 are connected to WLL4.

FIG. 10A depicts an initial threshold distribution of an example two-pass programming operation involving four data states. Initially, the cells are all in the erased (Er) state as represented by the threshold distribution (Vth) distribution 900. The vertical axis indicates the number of cells and the horizontal axis indicates a Vth.

FIG. 10B depicts a threshold distribution which results after a first pass of the example two-pass programming operation of FIG. 10A. Based on write data as indicated, the cells which are to remain in the Er state, or programmed to the A state, are represented by the Vth distribution 900, while the cells which are to be programmed to the B and C states are programmed to an intermediate (INT) distribution 902. This programming pass may be referred to as an intermediate pass in which a verify level of VvINT is used.

FIG. 10C depicts a threshold distribution which results after a second pass of the example two-pass programming operation of FIG. 10A. Based on write data as indicated, the cells which are to remain in the Er state are represented by the Vth distribution 900. The cells which are to be programmed to the A state using a verify voltage of VvA are represented by the distribution 910. The cells which are to be programmed to the B and C states using verify voltages of VvB and VvC, respectively, are represented by the distributions 912 and 914, respectively. Each data state represents two bits of data as indicated. Generally, a multi-pass programming process can help in achieving narrower Vth distributions, especially for the higher states. Read voltages VrA, VrB and VrC can be used for reading the states of the cells in a read operation.

FIG. 11A depicts an initial threshold distribution of an example two-pass programming operation involving eight data states. Initially, the cells are all in the erased (Er) state as represented by the threshold distribution (Vth) distribution 1100. The vertical axis indicates the number of cells and the horizontal axis indicates a Vth.

FIG. 11B depicts a threshold distribution which results after a first pass of the example two-pass programming operation of FIG. 11A. Based on write data as indicated, the cells which are to remain in the Er state, or programmed to the A, B and C states, are represented by the Vth distribution 1100, while the cells which are to be programmed to the D, E, F and G states are programmed to an intermediate (INT) distribution 1102. This programming pass may be referred to as an intermediate pass in which a verify level of VvINT is used.

FIG. 11C depicts a threshold distribution which results after a second pass of the example two-pass programming operation of FIG. 11A. Based on the write data as indicated, the cells which are to remain in the Er state are represented by the Vth distribution 1100. The cells which are to be programmed to the A, B and C states using verify voltages of VvA, VvB and VvC, respectively, are represented by the Vth distributions 1110, 1112 and 1114, respectively. The cells which are to be programmed to the D, E, F and G states using verify voltages of VvD, VvE, VvF and VvG, respectively, are represented by the Vth distributions 1116, 1118, 1120 and 1122, respectively. Each data state represents three bits of data as indicated. Read voltages VrA, VrB and VrC can be used for reading the states of the cells in a read operation.

Other example programming operations may use additional data states and/or programming passes. A single-pass programming operation could also be used.

FIG. 12 depicts a series of program-verify iterations in an example of a programming pass for a lower page of data, consistent with FIGS. 10B and 11B. The horizontal axis depicts program verify (PV) iteration number, or time, and the vertical axis depicts voltage. The pulse train 1300 includes a series of program pulses 1301-1309. Example verify pulses include an INT-state verify pulse 1310 (VvINT). The pulse train 1300 is an example of a first set of step-wise increasing program voltages. Vpgm_init1 is an example of an initial value of a first set of step-wise increasing program voltages.

A pulse train typically includes program pulses which increase stepwise in amplitude in one or more program-verify iterations of a programming pass using a fixed or varying step size. In some cases, the program pulses increase in each program-verify iteration after the first. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

FIG. 13 depicts a series of program-verify iterations in an example of a programming pass for an upper page of data, consistent with FIG. 10C. A similar series of program-verify iterations can be provided for the example programming pass of FIG. 11C. The horizontal axis depicts a program-verify iteration number (PV) and the vertical axis depicts control gate or word line voltage. The pulse train 1500 includes a series of program pulses 1501-1515 that are applied to a word line selected for programming. The pulse train 1500 is an example of a second or third set of step-wise increasing program voltages. Vpgm_init2 is an example of an initial value of a third set of step-wise increasing program voltages. One, two or three verify pulses are provided after each program pulse as an example, based on the target data states which are being verified. For example, one or more of an example A-state verify pulse 1520 (VvA), B-state verify pulse 1521 (VvB) and C-state verify pulse 1522 (VvC) may be applied in different program-verify iterations.

Figure 14:
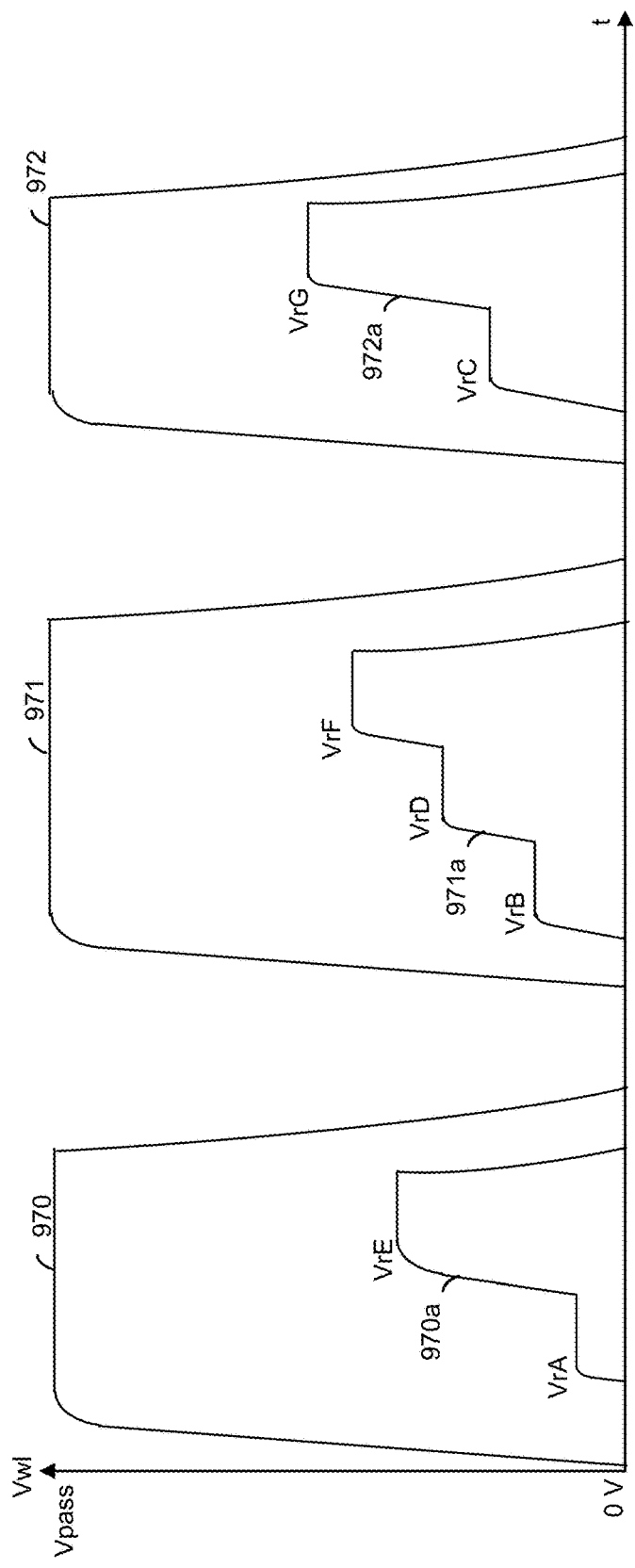
FIG. 14 depicts a plot of example waveforms in a read operation.

FIG. 14 depicts a plot of example waveforms in a read operation. A read operation may involve reading a number of pages of data—three pages in this example. A control gate read voltage is applied to a selected word line while a pass voltage, Vpass, is applied to the remaining unselected word lines. A sense circuit is then used to determine whether a cell is in a conductive state. Vpass is ramped up and then back down separately during the read voltages of each of the lower, middle and upper pages as depicted by plots 970, 971 and 972, respectively. This example is for an eight-state memory device, consistent with FIG. 11C. The example can be modified for fewer states (e.g., four states and two pages) or additional states (e.g., sixteen states and four pages).

For the first page, the A and E states are read using a read voltage waveform 970a having voltages of VrA and VrE, respectively. For the second page, the B, D and F states are read using a read voltage waveform 971a having voltages of VrB, VrD and VrF, respectively. For the third page, the C and G states are read using a read voltage waveform 972a having voltages of VrC and VrG, respectively. Optionally, the bit line and/or source line can be charged up in a read operation.

Figure 15A:
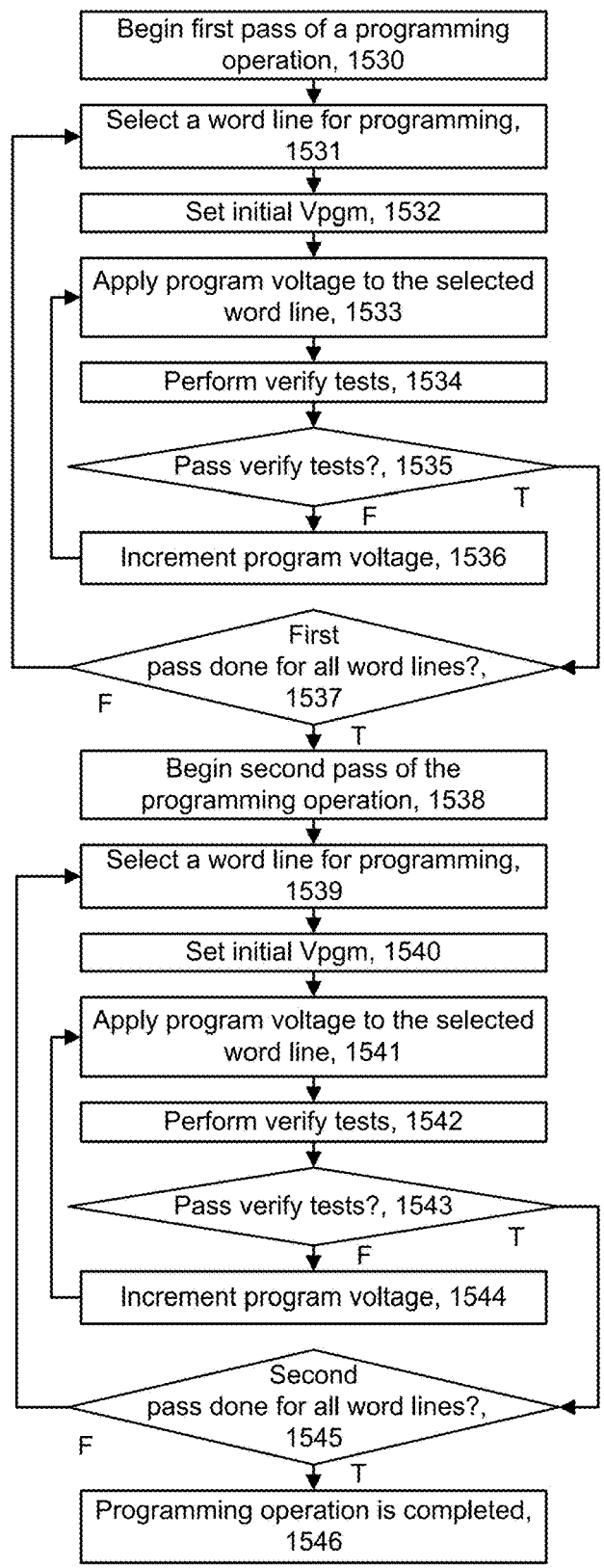
FIG. 15A depicts an example process for programming memory cells.

FIG. 15A depicts an example process for programming memory cells. A two-pass programming operation consistent with FIGS. 10A-10C and 11A-11C is depicted. Step 1530 begins the first pass of a programming operation. Step 1531 selects a word line for programming. Step 1532 sets an initial program voltage (Vpgm). Step 1533 includes applying a program voltage to the selected word line. Pass voltages can be applied to the unselected and dummy word lines. Step 1534 involves performing verify tests, e.g., by applying verify voltages. A decision step 1535 determines if programming of the selected word line is completed, e.g., whether the verify tests are passed. If decision step 1535 is true, a decision step 1537 determines if the first pass is done for all word lines, e.g., in a sub-block or block. If decision step 1537 is true, step 1538 begins the second pass of the programming operation.

If step 1535 is false, step 1536 increments the program voltage and step 1533 begins the next program-verify iteration or loop. If step 1537 is false, step 1531 selects another word line for programming.

In the second pass of the programming operation, step 1539 selects a word line for programming. Step 1540 sets an initial program voltage (Vpgm). Step 1541 includes applying a program voltage to the selected word line. Pass voltages can be applied to the unselected and dummy word lines. Step 1542 involves performing verify tests. A decision step 1543 determines if programming of the selected word line is completed, e.g., whether the verify tests are passed. If decision step 1543 is true, a decision step 1545 determines if the second pass is done for all word lines, e.g., in a sub-block or block. If decision step 1545 is true, the programming operation is completed at step 1546.

If step 1543 is false, step 1544 increments the program voltage and step 1541 begins the next program-verify iteration or loop. If step 1545 is false, step 1539 selects another word line for programming.

This example process therefore involves programming the memory cells of each word line in a set of word lines, one word line at a time, in a first programming pass. Once the first programming pass is completed for all word lines, the process programs the memory cells of each word line in the set of word lines, one word line at a time, in a second programming pass. In this approach, the meta region of each word line can be used to indicate whether the cells of the word line have completed the first programming pass. Generally, the cells of a block are all initially in the erased state. The internal controller of the memory device can keep track of which word line it has last programmed. However, the controller may not keep track of whether it is on the first or second programming pass. Moreover, the controller may interrupt a programming operation to perform other tasks of higher priority, and then resume the programming.

Accordingly, in one embodiment, some of the cells in the meta data region can be programmed to indicate whether the word line has completed the first programming pass. For example, in the eight state example of FIG. 11C, the cells in the meta data region can be kept in the erased state to indicate that the cells of the word line have not completed the first programming pass. This also indicates the cells of the word line have not completed the second programming pass. The cells in the meta data region can be programmed to one of the higher states to indicate that the cells of the word line have completed the first programming pass. It is desirable to use a data state for this which is far removed from the erased state so that the data can be reliably stored even if the Vth distributions of the cells in the meta data region change significantly due to disturbs, environmental conditions, defects or other factors. For example, the E, F or G state could be used since these are separated from the erased state by multiple other states.

In another possible approach, the cells in the meta data region are programmed to a mid-range state such as the C or D state to indicate that user data cells of the word line have completed the first programming pass but not the second programming pass, and the cells in the meta data region are programmed to a higher state such as the F or G state to indicate that user data cells of the word line have completed the second programming pass.

In many cases, the cells of a block are in a state in which they have completed programming. The cells in the meta data region will therefore be in a high state, potentially leading to the low current problem in the absence of the corrective measures provided herein.

The cells in the meta data region can be used to store various other types of information as well such as a number of program-erase cycles, a time stamp indicating the time of the last programming of the word lines, and data indicating a temperature at the time of the last programming of the word lines. The time stamp and the temperature can be used to adjust a read process (e.g., read voltages) for the word line which account for data retention loss which increases as the elapsed time since the last programming operation increases. The temperature can also be a factor in setting the read voltages. Depending on the coding scheme used, these types of meta data could also result in the cells being in a high state.

Figure 15B:
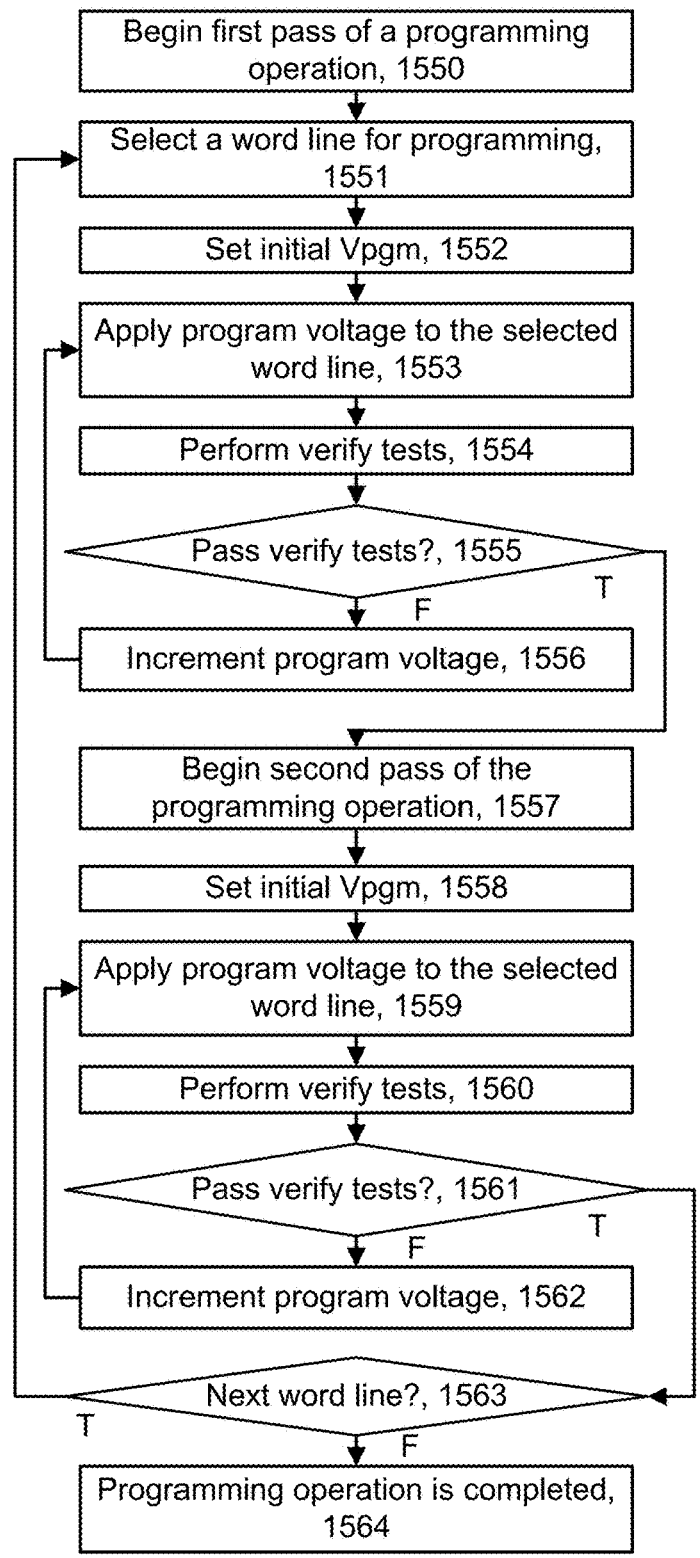
FIG. 15B depicts another example process for programming memory cells.

FIG. 15B depicts another example process for programming memory cells. A two-pass programming operation consistent with FIGS. 10A-10C and 11A-11C is depicted. Step 1550 begins the first pass of a programming operation. Step 1551 selects a word line for programming. Step 1552 sets an initial program voltage (Vpgm). Step 1553 includes applying the program voltage to the selected word line. Step 1554 involves performing verify tests. A decision step 1555 determines whether the verify tests are passed. If decision step 1555 is true, the second pass of the programming operation begins at step 1557.

If step 1555 is false, step 1556 increments the program voltage and step 1553 begins the next program-verify iteration or loop.

In the second pass of the programming operation, step 1558 sets an initial program voltage (Vpgm). Step 1559 includes applying the program voltage to the selected word line. Step 1560 involves performing verify tests. A decision step 1561 determines whether the verify tests are passed. If decision step 1561 is true, a decision step 1563 determines if there is a next word line to program. If decision step 1563 is true, a word line is selected at step 1551. If decision step 1563 is false, the programming operation is completed at step 1564.

If step 1561 is false, step 1562 increments the program voltage and step 1559 begins the next program-verify iteration or loop.

This example process therefore involves programming the memory cells of each word line using a first programming pass and then a second programming pass, before beginning programming of a next word line.

Some of the cells in the meta data region can be programmed to indicate whether the word line has completed the first programming pass, or the first or second programming pass, as discussed previously.

Figure 15C:
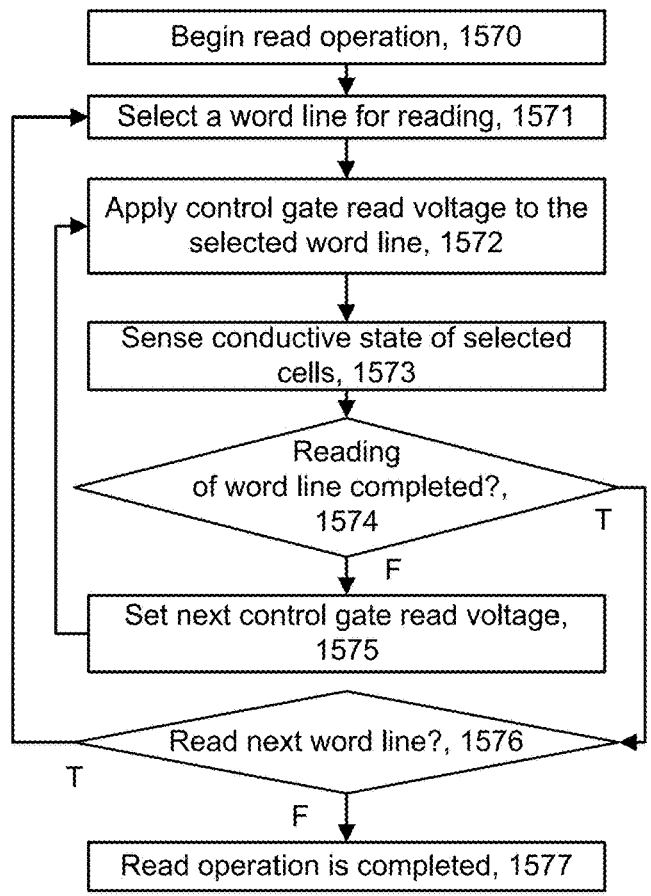
FIG. 15C depicts an example process for reading memory cells.

FIG. 15C depicts an example process for reading memory cells. Step 1570 begins a read operation. Step 1571 selects a word line for reading. Step 1572 includes applying a control gate read voltage to the selected word line. Pass voltages can be applied to the unselected and dummy word lines. Step 1573 involves sensing a conductive state of the selected cells, e.g., whether the cells are conductive or non-conductive. This can be done using sensing circuitry connected to the memory strings via bit lines.

A decision step 1574 determines if reading of the selected word line is completed, e.g., whether all of the control gate read voltages have been applied. If decision step 1574 is true, a decision step 1576 determines if there is a next word line to read. If decision step 1576 is false, the read operation is completed at step 1577. If decision step 1576 is true, a next word line is selected for reading at step 1571. If decision step 1574 is false, step 1575 sets the next control gate read voltage and step 1572 applies the next control gate read voltage and other voltages.

Figure 16A:
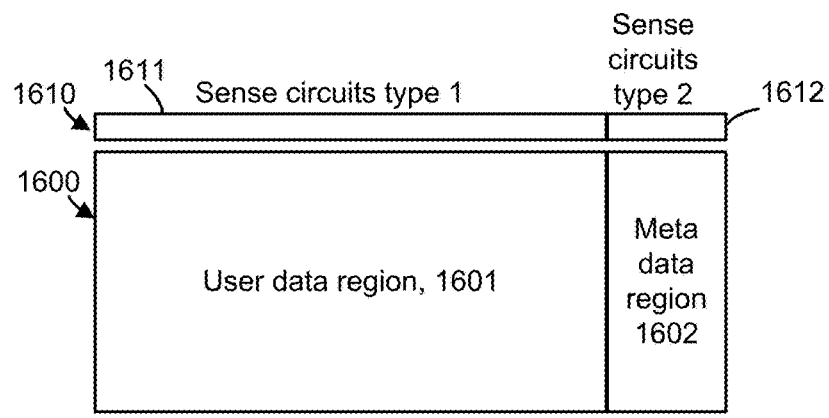
FIG. 16A depicts an example block of memory cells comprising a user data region and a meta data region.

FIG. 16A depicts an example block 1600 of memory cells comprising a user data region 1601 and a meta data region 1602. Data is typically arranged in units of pages. A page is a unit of reading or writing in the memory device. A page may include a set of cells connected to a common control line such as a word line, in one approach. A page of data can include a user data portion and an auxiliary or meta data portion, as mentioned. The user data portion may be an area which is addressable by a host device. In one example, the length of the page is 2112 bytes and includes 2048 bytes allocated for user data and 64 bytes allocated for meta data. The meta data can include various types of information such as error correction code (ECC) data which is obtained from encoding of the associated user data. Another type of meta data identifies the program pass which the cells of the associated word line have completed in a multi-pass programming operation.

A set of sense circuits 1610 is associated with the block. For example, a respective sense circuit may be connected to each respective memory string in the block. The set of sense circuits may include a first set of sense circuits 1611 of a first type (type 1) which are associated with the cells in the user data region, and a second set of sense circuits 1612 of a second type (type 2) which are associated with the cells in the meta data region. In one embodiment, the type 2 sense circuits comprise a BLC transistor with a smaller Vth than the BLC transistors of the type 1 sense circuits, to compensate for the presence of high state data in the meta data region.

The user data typically includes random data. That is, the user data is stored relatively uniformly in the different data states. The meta data can include data which tends to be non-random and which is likely to be represented by cells in high data states in some situations. The memory strings with high state meta data can comprise a subset of the memory strings allocated to meta data.

FIG. 16B depicts memory strings and respective BLC transistors in the example block of memory cells of FIG. 16A. This view depicts memory strings 1640-1641 in the user data region 1601 and memory strings 1642-1643 in the meta data region 1602. The memory strings 1640-1643 include example memory cells 1644-1647, respectively.

The type 1 sense circuits 1611 include BLC transistors 1613-1614 in a first set of transistors 1615 and in sense circuits 1613a-1614a, respectively. The BLC transistors 1613-1614 have control gates 1613g-1614g, respectively, and source terminals 1613s-1614s, respectively, which are connected to the memory strings 1640-1641 via bit lines 1613b-1614b, respectively. The type 2 sense circuits 1612 include BLC transistors 1616-1617 in a second set of transistors 1619 in sense circuits 1616a-1617a, respectively. The BLC transistors 1616-1617 have control gates 1616g-1617g, respectively, and source terminals 1616s-1617s, respectively, which are connected to the memory strings 1642-1643 via bit lines 1616b-1617b, respectively. A BLC control line 1618 receives a voltage Vblc from a voltage source 1648 and is connected to the control gates of each of the BLC transistors for the block, in one approach.

Each of the sense circuits can be similar to the sense circuit 400 of FIG. 3, for instance.

This example involves a plurality of memory strings, where each string comprises a set of series-connected memory cells among a set of memory cells. Further, there are a plurality of sense circuits 1613a-1614a and 1616a-1617a, where each sense circuit comprises a transistor 1613-1614 and 1616-1617 having a source terminal 1613s-1614s and 1616s-1617s connected to a respective memory string 1640-1643 of a plurality of memory strings, control gates 1613g-1614g and 1616g-1617g of the transistors are connected to a common voltage source 1648, the transistors comprise a first set of transistors 1613-1614 connected to a first set of the memory strings 1640, 1641 and a second set of transistors 1616-1617 connected to a second set of the memory strings 1642 and 1643, and the first set of transistors have a higher threshold voltage than the second set of transistors.

The drain terminals of the BLC transistors may be connected to a voltage source which is high enough to allow the BLC transistors to operate in a source-follower configuration.

FIG. 16C depicts an example pillar 1660 of a memory string having a channel layer 1662 with a relatively small width or thickness Th1. A dielectric core 1663 and other layers 1661, e.g., a blocking oxide, a charge-trapping layer and a tunneling layer, are also provided. As mentioned, a memory string with a relatively small channel width will have a relatively low current.

One option is to fabricate the channel width to be wider for memory strings in which the cells are expected to be in a high state for a substantial portion of the lifetime of the memory device. This is an example of fabricating the channel width based on a data pattern.

FIG. 16D depicts an example pillar 1670 of a memory string having a channel layer 1672 with a relatively large width or thickness Th2>Th1. A dielectric core 1673 and other layers 1671, e.g., a blocking oxide, a charge-trapping layer and a tunneling layer, are also provided.

Figure 18:
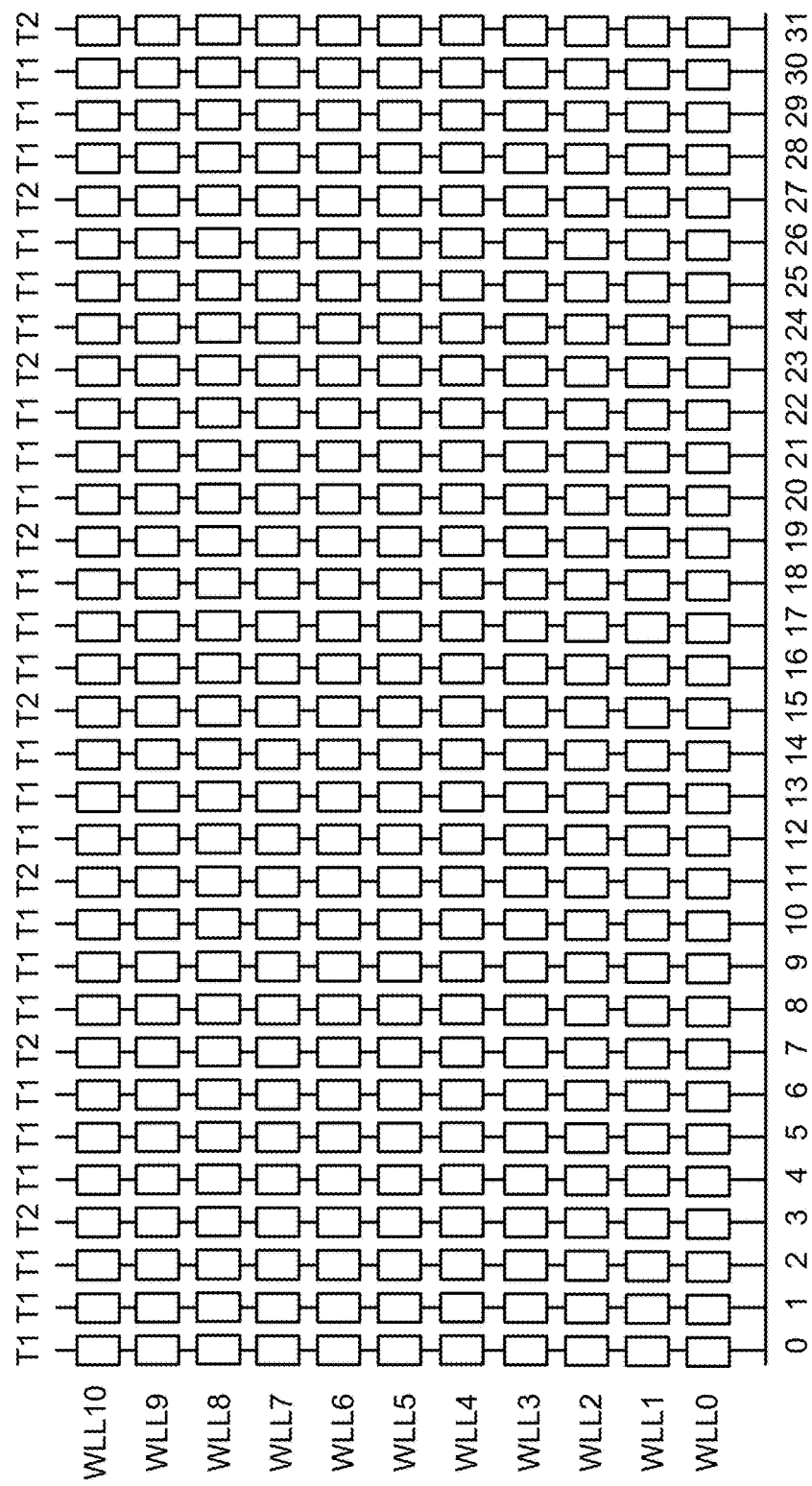
FIG. 18 depicts a set of memory strings in a block where the channel widths of the memory strings vary according to a repeating pattern due to non-uniformities in the fabrication process.

FIG. 17A depicts an example of the meta data region 1602 of FIG. 16A where the cells are all in the erased (1) state. In FIG. 17A-18, each memory cell is depicted by a rectangle. The cells are in sixteen memory strings and eleven word lines. In this case, sixteen bits or two bytes of meta data can be stored on each word line. The memory strings include one set of memory strings 1602a and another set of memory strings 1602b.

The sixteen cells in each word line may store data indicating whether the word line has completed a particular programming pass in a multi-pass programming operation. For reliability, the data can be stored redundantly in each of the sixteen bits. When the data is need, each cell is read, and the results are evaluated using a majority voting process.

FIG. 17B depicts an example of the meta data region 1602 of FIG. 16A where the cells are all in the programmed (0) state. The cells are all in a relatively high state so that the current in the strings during sensing will be low unless a countermeasure is taken such as adjusting the BLC transistors to have a higher clamping voltage (via a lower Vth), increasing the channel width and/or increase a channel doping concentration.

FIG. 17C depicts an example of the meta data region 1602 of FIG. 16A where bytes of erased state data (1) and programmed state data (0) alternate in successive rows. For example, the row of WLL0 includes a set of eight cells 1710 in the set of memory strings 1602a in the 1 state, and a set of eight cells 1711 in the set of memory strings 1602b in the 0 state. The next row of WLL1 includes a set of eight cells 1712 in the set of memory strings 1602a in the 0 state, and a set of eight cells 1713 in the set of memory strings 1602b in the 1 state. In this approach, the cells in the 1 (erased state) are not used to store data. The cells in the 0 (high) state are used to store data but their relative position is varied in the different word lines. This reduces the number of high state cells in a given memory string so that the current does not become too low.

Another option is to vary the sets of cells over more than two possible sets of memory strings. Another option is to vary the sets of cells over different word lines but not necessarily in alternating word lines. For example, in the set of memory strings 1602a, a byte of 1's can be provided in WLL0 and WLL1, followed by a bytes of 0's in WLL2 and WLL3, and so forth. In the set of memory strings 1602b, a byte of 0's can be provided in WLL0 and WLL1, followed by a bytes of 1's in WLL2 and WLL3, and so forth.

In one approach, a control circuit can be configured to vary a position of a subset of the memory cells allocated to meta data in different word lines of a set of word lines when a temperature is below a threshold. When temperature decreases, the Vth of the BLC transistors increases, resulting in a smaller clamping voltage on the low current memory strings. To counteract this effect and avoid the problems associated with excessively low string current during sensing, the locations of cells allocated to meta data can be varied in different word lines to reduce a number of high state cells in a given string. This reduces the string resistance and increase the string current. This variation can be triggered based on temperature in one approach, so that the variation is not used if the temperature is above a threshold. The variation is implemented at the time of programming. The technique is helpful when a sensing operation occurs when the temperature is below the threshold.

The subset of the memory cells allocated to meta data may store data indicating whether a respective word line of a set of word lines has completed programming. The subset of the memory cells allocated to meta data are in a relatively high threshold voltage state when the programming has been completed for the respective word line and in a relatively low threshold voltage state when the programming has not been completed for the respective word line.

In another approach, the subset of the memory cells allocated to meta data are in the relatively low threshold voltage state when at least one programming pass but fewer than all programming passes of a multi-pass programming operation have been completed for the respective word line.

In another approach, a position of the subset of the memory cells allocated to meta data is different in different word lines of the set of word lines.

In another approach, a control circuit is configured to vary a position of the subset of the memory cells allocated to meta data in different word lines of the set of word lines when a temperature is below a threshold.

A programming process can be modified to check the temperature. If the temperature is below a threshold, the programming of the meta data cells can be modified as discussed. In one approach, the modification reduces a redundancy of the meta data. For example, in FIG. 17C, one byte of data is used instead of two bytes, so the redundancy is reduced by one half. However, there may still be a sufficient redundancy when each cell stores a same bit and a read result is obtained from a majority voting process.

FIG. 18 depicts a set of memory strings in a block where the channel widths of the memory strings vary according to a repeating pattern due to non-uniformities in the fabrication process. The memory strings are numbered from 0-31 at the bottom, while a BLC transistor type (either T1, type 1, or T2, type 2) is depicted at the top for each memory string. In this pattern, every fourth transistor is of type T2 and the remaining transistors are of type T1. For example, the transistors of type T1 are associated with the memory strings numbered 0-2, 4-6, 8-10, 12-14, 16-18, 20-22, 24-26 and 28-30, and the transistors of type T2 are associated with the memory strings numbered 3, 7, 11, 15, 19, 23, 27 and 31. The type T2 transistors can have a lower Vth, for example, to compensate for the associated memory strings having a reduced channel width due to non-uniformities in the fabrication process. A further option is to have transistors of more than two types to compensate for the associated memory strings having a reduced channel widths of two or more types.

In another example, every other transistor is configured to be of one type and the remaining transistors are configured to be of another type.

For example, in a 2D memory device, non-uniformities can be caused by multiple patterning lithography techniques such as spacer-based double patterning or quadruple spacer patterning. These techniques can result in systematic variations in the channel width and the corresponding memory string resistance. The variations may be caused by wafer level trends and layout pattern dependencies. Factors can include chemical mechanical polishing variations causing film thickness variations, variations in line width due to optical diffraction and interference, mask or lens distortions in the photolithographic system, or plasma etch microloading effects. Non-uniformities can also be present in a 3D memory device.

Figure 19A:
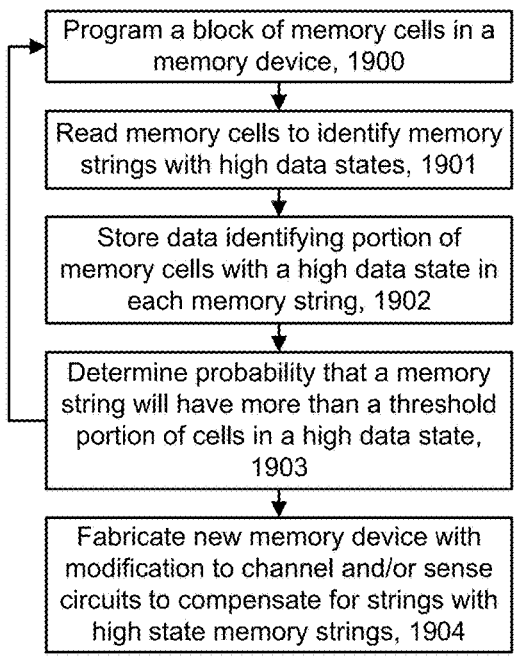
FIG. 19A depicts an example process for identifying memory strings which are likely to have memory cells in a high state.

FIG. 19A depicts an example process for identifying memory strings which are likely to have memory cells in a high state. Step 1900 includes programming a block of memory cells in a memory device. For example, this can include typical programming of the user data region and the meta data region. Step 1901 includes reading memory cells to identify memory strings with high data states. A high data state can be a data state above a specified data state or a Vth level above a specified Vth, for instance. Step 1902 includes storing data identifying a portion of the memory cells with a high data state in each memory string. Step 1903 includes determining a probability that a memory string will have more than a threshold portion of cells in a high state. For example, assume there are 5 passes through steps 1900-1903 and that the portion of high state cells is 80%, 70%, 60%, 90%, and 70%. The probability is therefore (0.8+0.7+0.6+0.9+0.7)/5=0.74.

Step 1904 includes fabricating a new memory device with a modification to the channels and/or sense circuits to compensate for strings with high state memory cells. For example, these can be the strings for which the probability exceeds a specified level. The data gathering of steps 1900-1903 can occur in one or more memory devices. One useful option is to gather the data for a population of end users of a set of memory devices under real-world conditions over a period of time such as weeks or months. This helps provide a representative view of the memory device usage. This approach predicts the data pattern on a per-string basis to identify potential low current strings. The strings can be in the meta data region as mentioned. It is also possible that patterns are detected in the user data region which identify strings which are likely to have a low current due to many of its cells being in a high data state.

Figure 19B:
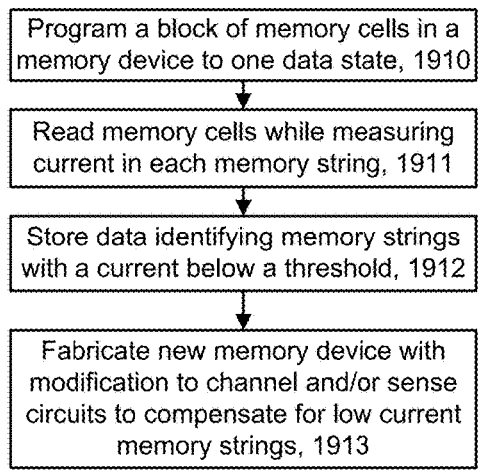
FIG. 19B depicts an example process for identifying memory strings which are likely to have a low current during a read operation.

FIG. 19B depicts an example process for identifying memory strings which are likely to have a low current during a read operation. Step 1910 includes programming a block of memory cells in a memory device to one data state, for instance. Or, the cells in each memory string can be programmed to different states but the pattern should be the same in each string. A goal is to provide each string in a similar configuration so that the current in each string would be the same under ideal conditions in which there are no physical non-uniformities in the strings. Step 1911 includes reading the memory cells while measuring the current in each string. One approach uses a current measuring device to measure the current in a testing environment rather than when the memory device is in the hands of the end user. Step 1912 includes storing data identifying memory strings with a current below a threshold. Step 1913 includes fabricating a new memory device with a modification to the channels and/or sense circuits to compensate for low current memory strings.

A theory of this process is that non-uniformities in the fabrication process will result in some strings having a lower current. For example, this could be due to the channel being thinner than other channels so that the resistance is higher and the current is therefore lower. These non-uniformities in the tested devices are expected to be repeated in the new memory devices.

Figure 19C:
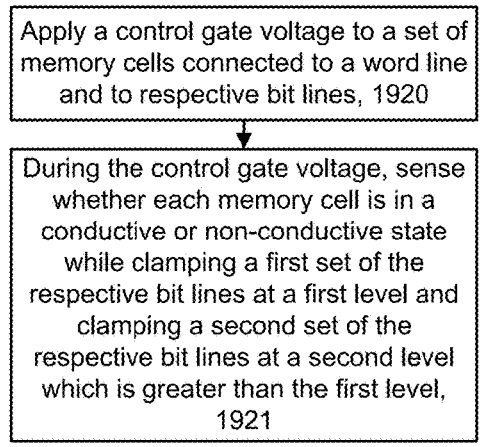
FIG. 19C depicts an example process for programming a set of memory cells while clamping a bit line voltage.

FIG. 19C depicts an example process for programming a set of memory cells while clamping a bit line voltage. Step 1920 includes applying a control gate voltage to a set of memory cells connected to a word line and to respective bit lines. Step 1921 includes, during the control gate voltage, sensing whether each memory cell is in a conductive or non-conductive state while clamping a first set of the respective bit lines at a first level and clamping a second set of the respective bit lines at a second level which is greater than the first level.

For example, in FIG. 16B, assume WLL10 is the selected word line. The set of memory cells includes cells 1644, 1645, 1646 and 1647. The first set of the respective bit lines includes bit lines 1613b-1614b and the second set of the respective bit lines includes bit lines 1616b-1617b. The process can be included in connection with a multi-pass programming operation such as in FIG. 15A or 15B or in a single pass programming operation.

The memory cells connected to the second set of the respective bit lines are more likely to be in a higher state than memory cells connected to the second set of the respective bit lines.

Further, memory cells connected to the second set of the respective bit lines may comprise meta data which tracks a program pass in a multipass programming operation, and have a relatively high threshold voltage when the program pass is a final program pass in the multipass programming operation than when the program pass is an earlier program pass in the multipass programming operation.

The memory cells connected to the first set of the respective bit lines may be reserved for storing user data in N data states (e.g., N=4 in FIG. 10C and N=8 in FIG. 11C); and memory cells connected to the second set of the respective bit lines store the meta data in fewer than N data states.

The sensing comprises allowing sense nodes of the sense circuits to communicate with the respective bit lines during the clamping of the first set of the respective bit lines at the first level and the clamping of the second set of the respective bit lines at the second level.

The clamping of the first set of the respective bit lines at the first level and the clamping of the second set of the respective bit lines at the second level may include applying a common control gate voltage to a transistor in each sense circuit which is connected to one of the respective bits lines, where the transistors comprise a first set of transistors connected to the first set of the respective bit lines and a second set of transistors connected to the second set of the respective bit lines, and the first set of transistors have a higher threshold voltage than the second set of transistors.

Each transistor may comprise a source terminal connected to one of the respective bit lines and is configured as a source-follower to apply a voltage on one of the respective bit lines based on a difference between the common control gate voltage and the threshold voltage of the transistor.

In one embodiment, an apparatus comprises: means for providing a first voltage to a first set of bit lines during a sensing operation; means for providing a second voltage, lower than the first voltage, to a second set of bit lines during the sensing operation; and a common control gate voltage connected to the means for providing the first voltage and the means for providing the second voltage.

The means for providing the first and second voltages can include the control circuits such as the power control module 116 and the column decoder 132 of FIG. 1A, the sense block 51 of FIGS. 1A and 2, and the sense circuit 400 of FIG. 3, or other logic hardware, and/or other executable code stored on a computer readable storage medium. The means for providing the common control gate voltage can include the control circuits such as the power control module 116 and the row decoder 124 of FIG. 1A, or other logic hardware, and/or other executable code stored on a computer readable storage medium. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A memory device, comprising:
a plurality of NAND strings comprising a first set of NAND strings and a second set of NAND strings;
a plurality of bit lines connected to the plurality of NAND strings, each NAND string of the plurality of NAND strings is connected to respective bit line of the plurality of bit lines; and
a plurality of sense circuits connected to the plurality of bit lines, each sense circuit comprises a transistor connected to a respective bit line of the plurality of bit lines and configured to set a voltage of the respective bit line, the transistors of the plurality of sense circuits comprise control gates which are connected to a common voltage source, the transistors of the plurality of sense circuits comprise a first set of transistors connected to respective bit lines of the first set of NAND strings and a second set of transistors connected to respective bit lines of the second set of NAND strings, and the first set of transistors have a higher threshold voltage than the second set of transistors.

2. The memory device of claim 1, wherein:
channels of the first set of NAND strings are wider and/or have a higher doping concentration than channels of the second set of NAND strings.

3. The memory device of claim 2, wherein:
the second set of NAND strings are arranged in a repeating pattern in the plurality of NAND strings.

4. The memory device of claim 1, wherein:
the first set of NAND strings comprise memory cells allocated to user data; and
the second set of NAND strings comprises memory cells allocated to meta data.

5. The memory device of claim 4, wherein:
the plurality of NAND strings comprises a set of memory cells connected to a set of word lines;
a subset of the memory cells are allocated to meta data store data indicating whether a respective word line of the set of word lines has completed programming; and the subset of the memory cells allocated to meta data are in a relatively high threshold voltage state when the programming has been completed for the respective word line and in a relatively low threshold voltage state when the programming has not been completed for the respective word line.

6. The memory device of claim 5, wherein:
the subset of the memory cells allocated to meta data are in the relatively low threshold voltage state when at least one programming pass but fewer than all programming passes of a multi-pass programming operation have been completed for the respective word line.

7. The memory device of claim 5, wherein:
a position of the subset of the memory cells allocated to meta data is different in different word lines of the set of word lines.

8. The memory device of claim 5, further comprising:
a control circuit configured to vary a position of the subset of the memory cells allocated to meta data in different word lines of the set of word lines when a temperature is below a threshold.

9. The memory device of claim 1, wherein:
the second set of transistors comprise at least one of shorter control gate length, a smaller oxide thickness, a smaller oxide dielectric constant, or a greater source and/or drain doping concentration, compared to the first set of transistors.

10. The memory device of claim 1, wherein:
each transistor of the plurality of sense circuits is configured as a source-follower to set the voltage on the respective NAND string during a sensing operation; and
a voltage set on the second set of NAND strings is greater than a voltage set on the first set of NAND strings.

11. A method, comprising:
applying a control gate voltage to a set of memory cells connected to a word line, the set of memory cells comprises memory cells in a first set of NAND strings and memory cells in a second set of NAND strings, the first set of NAND strings are connected to a first set of bit line clamp transistors via a first set of bit lines, the second set of NAND strings are connected to a second set of bit line clamp transistors via a second set of bit lines, the first set of bit line clamp transistors are in a first set of sense circuits and the second set of bit line clamp transistors are in a second set of sense circuits; and
during the control gate voltage, sensing whether each memory cell of the set of memory cells is in a conductive or non-conductive state, the sensing comprises clamping a voltage of the first set of bit lines at a first level using the first set of bit line clamp transistors and clamping a voltage of the second set of bit lines at a second level which is greater than the first level using the second set of bit line clamp transistors, wherein the first set of bit line clamp transistors have a higher threshold voltage than the second set of bit line clamp transistors.

12. The method of claim 11, wherein:
the memory cells in the second set of NAND strings are more likely to be in a higher state than the memory cells in the first set of NAND strings.

13. The method of claim 11, wherein:
the memory cells in the second set of NAND strings comprise meta data which tracks a program pass in a multipass programming operation, and have a relatively high threshold voltage when the program pass is a final program pass in the multipass programming operation than when the program pass is an earlier program pass in the multipass programming operation.

14. The method of claim 11, wherein:
the memory cells in the first set of NAND strings are reserved for storing user data in N data states; and
the memory cells in the second set of NAND strings store meta data in fewer than N data states.

15. The method of claim 11, wherein:
during the sensing, the first set of bit line clamp transistors allow sense nodes of the first set of sense circuits to communicate with the first set of bit lines during the clamping of the voltage of the first set of bit lines at the first level and the second set of bit line clamp transistors allow sense nodes of the second set of sense circuits to communicate with the second set of bit lines during the clamping of the voltage of the second set of bit lines at the second level.

16. The method of claim 11, wherein:
the clamping of the first set of bit lines at the first level and the clamping of the second set of bit lines at the second level comprises applying a common control gate voltage to the first set of bit line clamp transistors and to the second set of bit line clamp transistors.

17. An apparatus, comprising:
a first set of memory cells in a first set of NAND strings;
a second set of memory cells in a second set of NAND strings;
a first set of bit lines connected to the first set of NAND strings;
a second set of bit lines connected to the second set of NAND strings;
means for providing a first voltage to the first set of bit lines during a sensing operation, the means for providing the first voltage comprises a first set of transistors connected to the first set of bit lines;
means for providing a second voltage, lower than the first voltage, to the second set of bit lines during the sensing operation, the means for providing the second voltage comprises a second set of transistors connected to the second set of bit lines, wherein the first set of transistors have a different threshold voltage than the second set of transistors; and
a voltage source connected to control gates of the first set of transistors and the second set of transistors, the voltage source configured to provide a common voltage to the control gates of the first set of transistors and the second set of transistors during the sensing operation.

18. The apparatus of claim 17, wherein:
the first and second voltages are set based on a data pattern of the first set of memory cells and the second set of memory cells.

19. The memory device of claim 1, wherein:
each sense circuit of the plurality of sense circuits comprises a current sensing module; and
in each sense circuit of the plurality of sense circuits, the transistor is configured to allow the current sensing module to communicate with bit line.

\* \* \* \* \*